(12) United States Patent
Lansalot-Matras et al.

(10) Patent No.: US 10,023,462 B2
(45) Date of Patent: Jul. 17, 2018

(54) NIOBIUM-NITRIDE FILM FORMING COMPOSITIONS AND VAPOR DEPOSITION OF NIOBIUM-NITRIDE FILMS

(71) Applicant: L'Air Liquide, Société Anonyme pour l'Etude et l'Exploitation des Procédés Georges Claude, Paris (FR)

(72) Inventors: Clément Lansalot-Matras, Morrisville, PA (US); Julien Lieffrig, Soucy (FR); Jooho Lee, Seoul (KR); Wontae Noh, Seoul (KR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 287 days.

(21) Appl. No.: 14/954,351

(22) Filed: Nov. 30, 2015

(65) Prior Publication Data

US 2017/0152144 A1  Jun. 1, 2017

(51) Int. Cl.
 C23C 16/34 (2006.01)
 C23C 16/455 (2006.01)
 C01B 21/06 (2006.01)

(52) U.S. Cl.
 CPC .......... C01B 21/0617 (2013.01); C23C 16/34 (2013.01); C23C 16/45536 (2013.01); C23C 16/45553 (2013.01)

(58) Field of Classification Search
 CPC .............. C23C 16/34; C23C 16/45536; C23C 16/45553; C01B 21/0617
 USPC .................. 106/1.25, 287.18, 287.3; 423/409
 See application file for complete search history.

(56) References Cited

U.S. PATENT DOCUMENTS

| | | | |
|---|---|---|---|
| 8,236,979 B2 * | 8/2012 | Dussarrat .......... | C23C 16/45553 556/35 |
| 8,298,616 B2 * | 10/2012 | Dussarrat .......... | C23C 16/45553 427/226 |
| 8,460,989 B2 * | 6/2013 | Blasco ............... | C07F 9/00 427/250 |
| 9,518,075 B2 * | 12/2016 | Lansalot-Matras ..... | C07F 17/00 |
| 9,786,671 B2 * | 10/2017 | Lansalot-Matras . | H01L 27/1085 |
| 2006/0035462 A1 * | 2/2006 | Millward ............ | C23C 16/308 438/681 |
| 2008/0102205 A1 | 5/2008 | Barry et al. | |
| 2008/0305260 A1 * | 12/2008 | Shenai-Khatkhate .......... | C23C 16/405 427/255.394 |
| 2009/0017208 A1 * | 1/2009 | Shenai-Khatkhate .......... | C23C 16/405 427/255.38 |
| 2016/0083405 A1 * | 3/2016 | Lansalot-Matras ..... | C07F 17/00 252/182.3 |
| 2016/0251756 A1 * | 9/2016 | Lansalot-Matras ..... | C23C 16/18 427/252 |
| 2016/0307904 A1 * | 10/2016 | Lansalot-Matras . | H01L 27/1085 |
| 2017/0152277 A1 * | 6/2017 | Lim .................. | H01L 27/10879 |
| 2017/0298511 A1 * | 10/2017 | Lansalot-Matras ............. | C23C 16/45553 |

FOREIGN PATENT DOCUMENTS

EP  1921061 A1 *  5/2008

OTHER PUBLICATIONS

Tin et al., "Guanidinate anions and dianions. Reactions involving alkyl-guanidines, (RNH)2CNR (R=i-Pr or Cy), and metal amido complexes M(NMe2)5 (M=Ta or Nb)", Journal of the Chemical Society, Dalton Transactions, 2947-2951, Jul. 1999; 5 pages.*
Alén, P. et al., "The growth and diffusion barrier properties of atomic layer deposited NbNx thin films," Thin Solid Films, 2005, 491, 235-241.
Dunn, S.C. et al., "Cyclopentadienyl, indenyl and bis(cyclopentadienyl) titanium imido compounds," J. Chem. Soc., Dalton Trans., 1997, 293-304.
Elers, K.E. et al., "NbCl$_5$ as a precursor in atomic layer epitaxy," Applied Surface Science, 1994, 82-83.
Forsgren, K. et al., "Halide chemical vapour deposition of Ta$_2$O$_5$," Thin Solid Films, 1999, 343-344, 111-114.
Guiducci, A.E. et al., "Reactions of cyclopentadienyl-amidinate titanium imido compounds with CS$_2$, COS, isocyanates, and other unsaturated organic compounds," Organometallics, 2006, 25, 1167-1187.
Haehnel, M. et al., "Reactions of titanocene bis(trimethylsilyl)acetylene complexes with carbodiimides: an experimental and theoretical study of complexation versus C—N bond activation," J. Am. Chem. Soc., 2012, 134, 15979-15991.
Knapas, K. et al., "Etching of Nb$_2$O$_5$ thin films by NbCl$_5$," Chem. Vap. Deposition 2009, 15, 269-273.
Kukli, K. et al., "Niobium oxide thin films grown by atomic layer epitaxy," Chem. Vap. Deposition, 1998, 4(1), 29-34.
Lintanf-Salaün, A. et al., "Atomic layer deposition of tantalum oxide thin films for their use as diffusion barriers in microelectronic devices," Microelectronic Engineering, 2010, 87, 373-378.
Ritala, M. et al., "Effects of intermediate zinc pulses on properties of TiN and NbN films deposited by atomic layer epitaxy," Applied Surface Science, 1997, 120(3-4), 199-212.
Wasslen, Y.A. et al., "A family of heteroleptic titanium guanidinates: synthesis, thermolysis, and surface reactivity," Inorg. Chem. 2010, 49, 1976-1982.
Haehnel, M. et al., "Reactions of group 4 metallocenes with N,N'-diphenylformamidine—hydrogen generation versus oxidative addition," Z. Anorg. Allg. Chem. 2014, 2532-2536.

* cited by examiner

*Primary Examiner* — Helene Klemanski
(74) *Attorney, Agent, or Firm* — Patricia E. McQueeney

(57) ABSTRACT

Disclosed are Niobium Nitride film forming compositions, methods of synthesizing the same, and methods of forming Niobium Nitride films on one or more substrates via vapor deposition processes using the Niobium Nitride film forming precursors.

16 Claims, 17 Drawing Sheets

NIOBIUM-NITRIDE FILM FORMING COMPOSITIONS AND VAPOR DEPOSITION OF NIOBIUM-NITRIDE FILMS

TECHNICAL FIELD

Disclosed are Niobium-Nitride film forming compositions, methods of synthesizing the same, and methods of forming Niobium Nitride films on one or more substrates via vapor deposition processes using the Niobium Nitride film forming precursors.

BACKGROUND

Metal Nitride films, such as Niobium Nitride ($NbN_x$ wherein x is approximately 1) have been extensively utilized in various fields of technology. Traditionally these nitrides have been applied as hard and decorative coatings but during the past decade they have increasingly been used as diffusion barrier and adhesion/glue layers In microelectronic devices [Applied Surface Science 120 (1997) 199-212]. $NbCl_5$ for instance has been examined as a niobium source for Atomic Layer Epitaxial growth of $NbN_x$, but the process required Zn as a reducing agent [Applied Surface Science 82/83 (1994) 468-474]. $NbN_x$ films were also deposited by atomic layer deposition using $NbCl_5$ and $NH_3$. [Thin Solid Films 491 (2005) 235-241]. The chlorine content showed strong temperature dependence as the film deposited at 500° C. was almost chlorine free, while the chlorine content was 8 at. % when the deposition temperature was as low as 250° C. Id. The high melting point of $NbCl_5$ also makes this precursor difficult to use in the vapor deposition process.

A need remains for developing liquid or low melting point (<50° C.), highly thermally stable, Niobium Nitride precursor molecules suitable for vapor phase film deposition with controlled thickness and composition at high temperature.

NOTATION AND NOMENCLATURE

Certain abbreviations, symbols, and terms are used throughout the following description and claims, and include:

As used herein, the indefinite article "a" or "an" means one or more.

As used herein, the terms "approximately" or "about" mean±10% of the value stated.

The standard abbreviations of the elements from the periodic table of elements are used herein. It should be understood that elements may be referred to by these abbreviations (e.g., Nb refers to Nobium, N refers to nitrogen, C refers to carbon, etc.).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example In the formula $MR^1_x$ $(NR^2R^3)_{(4-x)}$, where x is 2 or 3, the two or three $R^1$ groups may, but need not be identical to each other or to $R^2$ or to $R^3$.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl.

Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a "normal" or linear propyl group; the abbreviation "iPr" refers to an isopropyl group; the abbreviation "Bu" refers to a butyl group; the abbreviation "nBu" refers to a "normal" or linear butyl group; the abbreviation "tBu" refers to a tert-butyl group, also known as 1,1-dimethylethyl; the abbreviation "sBu" refers to a sec-butyl group, also known as 1-methylpropyl; the abbreviation "iBu" refers to an iso-butyl group, also known as 2-methylpropyl; the abbreviation "amyl" refers to an amyl or pentyl group; the abbreviation "tAmyl" refers to a tert-amyl group, also known as 1,1-dimethylpropyl.

As used herein, the abbreviation "Cp" refers to cyclopentadlenyl group; the abbreviation "Cp*" refers to a pentamethylcyclopentadienyl group; the abbreviation "TMS" refers to trimethylsilyl ($Me_3Si$—).

As used herein, the abbreviation "$N^{R, R'}R''$-amd" or $N^R$ R"-amd when R=R' refers to the amidinate ligand [R—N—C(R")=N—R'], wherein R, R' and R" are defined alkyl groups, such as Me, Et, nPr, iPr, nBu, iBi, sBu or tBu; the abbreviation "$N^{R, R'}$-fmd" or $N^R$-fmd when R=R' refers to the formidinate ligand [R—N—C(H)=N—R'], wherein R and R' are defined alkyl groups, such as Me, Et, nPr, iPr, nBu, iBi, sBu or tBu; the abbreviation "$N^{R, R'}, N^{R'', R'''}$-gnd" or $N^R$, $N^{R''}$-gnd when R=R' and R"=R''' refers to the guanidinate ligand [R—N—C(NR"R''')=NR'], wherein R, R', R" and R''' are defined alkyl group such as Me, Et, nPr, iPr, nBu, iBi, sBu or tBu. Although depicted here as having a double bond between the C and N of the ligand backbone, one of ordinary skill in the art will recognize that the amidinate, formidinate and guanidinate ligands do not contain a fixed double bond. Instead, one electron is delocalized amongst the N—C—N chain.

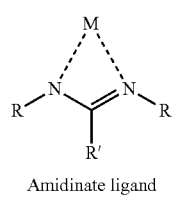

Amidinate ligand i)

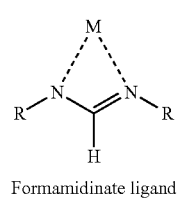

Formamidinate ligand ii)

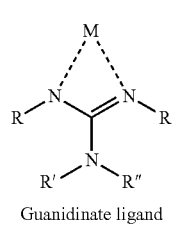

Guanidinate ligand iii)

SUMMARY

Disclosed are Niobium Nitride film forming compositions comprising a precursor having the formula:

$$Nb(R_5Cp)_2(L)$$

wherein each R is independently H, an alkyl group, or R'$_3$Si, with each R' Independently being H or an alkyl group; L is a formamidinate (N$^{R, R'}$-fmd), amidinate (N$^{R, R'}$ R"-amd), or guanidinate (N$^{R, R'}$, N$^{R'', R'''}$-gnd). The disclosed Niobium Nitride film forming precursor compositions may include one or more of the following aspects:

each R independently being selected from H, Me, Et, nPr, iPr, tBu, sBu, iBu, nBu, tAmyl, SiMe$_3$, SiMe$_2$H, or SiH$_2$Me;

L being formamidinate (N$^{R, R'}$-fmd or N$^R$-fmd when R=R');

the precursor being Nb(Cp)$_2$(N$^{Me}$-fmd);
the precursor being Nb(Cp)$_2$(N$^{Et}$-fmd);
the precursor being Nb(Cp)$_2$(N$^{iPr}$-fmd);
the precursor being Nb(Cp)$_2$(N$^{nPr}$-fmd);
the precursor being Nb(Cp)$_2$(N$^{iBu}$-fmd);
the precursor being Nb(Cp)$_2$(N$^{nBu}$-fmd);
the precursor being Nb(Cp)$_2$(N$^{tBu}$-fmd);
the precursor being Nb(Cp)$_2$(N$^{sBu}$-fmd);
the precursor being Nb(Cp)$_2$(N$^{tAm}$-fmd);
the precursor being Nb(Cp)$_2$(N$^{TMS}$-fmd);
the precursor being Nb(Cp)$_2$(N$^{Et, tBu}$-fmd);
the precursor being Nb(MeCp)$_2$(N$^{Me}$-fmd);
the precursor being Nb(MeCp)$_2$(N$^{Et}$-fmd);
the precursor being Nb(MeCp)$_2$(N$^{iPr}$-fmd);
the precursor being Nb(MeCp)$_2$(N$^{nPr}$-fmd);
the precursor being Nb(MeCp)$_2$(N$^{iBu}$-fmd);
the precursor being Nb(MeCp)$_2$(N$^{nBu}$-fmd);
the precursor being Nb(MeCp)$_2$(N$^{tBu}$-fmd);
the precursor being Nb(MeCp)$_2$(N$^{sBu}$-fmd);
the precursor being Nb(MeCp)$_2$(N$^{tAm}$-fmd);
the precursor being Nb(MeCp)$_2$(N$^{TMS}$-fmd);
the precursor being Nb(MeCp)$_2$(N$^{Et, tBu}$-fmd);
the precursor being Nb(EtCp)$_2$(N$^{Me}$-fmd);
the precursor being Nb(EtCp)$_2$(N$^{Et}$-fmd);
the precursor being Nb(EtCp)$_2$(N$^{iPr}$-fmd);
the precursor being Nb(EtCp)$_2$(N$^{nPr}$-fmd);
the precursor being Nb(EtCp)$_2$(N$^{iBu}$-fmd);
the precursor being Nb(EtCp)$_2$(N$^{nBu}$-fmd);
the precursor being Nb(EtCp)$_2$(N$^{tBu}$-fmd);
the precursor being Nb(EtCp)$_2$(N$^{sBu}$-fmd);
the precursor being Nb(EtCp)$_2$(N$^{tAm}$-fmd);
the precursor being Nb(EtCp)$_2$(N$^{TMS}$-fmd);
the precursor being Nb(EtCp)$_2$(N$^{Et, tBu}$-fmd);
the precursor being Nb(iPrCp)$_2$(N$^{Me}$-fmd);
the precursor being Nb(iPrCp)$_2$(N$^{Et}$-fmd);
the precursor being Nb(iPrCp)$_2$(N$^{iPr}$-fmd);
the precursor being Nb(iPrCp)$_2$(N$^{nPr}$-fmd);
the precursor being Nb(iPrCp)$_2$(N$^{iBu}$-fmd);
the precursor being Nb(iPrCp)$_2$(N$^{nBu}$-fmd);
the precursor being Nb(iPrCp)$_2$(N$^{tBu}$-fmd);
the precursor being Nb(iPrCp)$_2$(N$^{sBu}$-fmd);
the precursor being Nb(iPrCp)$_2$(N$^{tAm}$-fmd);
the precursor being Nb(iPrCp)$_2$(N$^{TMS}$-fmd);
the precursor being Nb(iPrCp)$_2$(N$^{Et, tBu}$-fmd);
the precursor being Nb(tBuCp)$_2$(N$^{Me}$-fmd);
the precursor being Nb(tBuCp)$_2$(N$^{Et}$-fmd);
the precursor being Nb(tBuCp)$_2$(N$^{iPr}$-fmd);
the precursor being Nb(tBuCp)$_2$(N$^{nPr}$-fmd);
the precursor being Nb(tBuCp)$_2$(N$^{iBu}$-fmd);
the precursor being Nb(tBuCp)$_2$(N$^{nBu}$-fmd);
the precursor being Nb(tBuCp)$_2$(N$^{tBu}$-fmd);
the precursor being Nb(tBuCp)$_2$(N$^{sBu}$-fmd);
the precursor being Nb(tBuCp)$_2$(N$^{tAm}$-fmd);
the precursor being Nb(tBuCp)$_2$(N$^{TMS}$-fmd);
the precursor being Nb(tBuCp)$_2$(N$^{Et, tBu}$-fmd);
the precursor being Nb(iPr$_3$Cp)$_2$(N$^{Me}$-fmd);
the precursor being Nb(iPr$_3$Cp)$_2$(N$^{Et}$-fmd);
the precursor being Nb(iPr$_3$Cp)$_2$(N$^{iPr}$-fmd);
the precursor being Nb(iPr$_3$Cp)$_2$(N$^{nPr}$-fmd);
the precursor being Nb(iPr$_3$Cp)$_2$(N$^{iBu}$-fmd);
the precursor being Nb(iPr$_3$Cp)$_2$(N$^{nBu}$-fmd);
the precursor being Nb(iPr$_3$Cp)$_2$(N$^{tBu}$-fmd);
the precursor being Nb(iPr$_3$Cp)$_2$(N$^{sBu}$-fmd);
the precursor being Nb(iPr$_3$Cp)$_2$(N$^{tAm}$-fmd);
the precursor being Nb(iPr$_3$Cp)$_2$(N$^{TMS}$-fmd);
the precursor being Nb(iPr$_3$Cp)$_2$(N$^{Et, tBu}$-fmd);
the precursor being Nb(Cp*)$_2$(N$^{Me}$-fmd);
the precursor being Nb(Cp*)$_2$(N$^{Et}$-fmd);
the precursor being Nb(Cp*)$_2$(N$^{iPr}$-fmd);
the precursor being Nb(Cp*)$_2$(N$^{nPr}$-fmd);
the precursor being Nb(Cp*)$_2$(N$^{iBu}$-fmd);
the precursor being Nb(Cp*)$_2$(N$^{nBu}$-fmd);
the precursor being Nb(Cp*)$_2$(N$^{tBu}$-fmd);
the precursor being Nb(Cp*)$_2$(N$^{sBu}$-fmd);
the precursor being Nb(Cp*)$_2$(N$^{tAm}$-fmd);
the precursor being Nb(Cp*)$_2$(N$^{TMS}$-fmd);
the precursor being Nb(Cp*)(N$^{Et, tBu}$-fmd);
the precursor being Nb(Me$_3$SiCp)$_2$(N$^{Me}$-fmd);
the precursor being Nb(Me$_3$SiCp)$_2$(N$^{Et}$-fmd);
the precursor being Nb(Me$_3$SiCp)$_2$(N$^{iPr}$-fmd);
the precursor being Nb(Me$_3$SiCp)$_2$(N$^{nPr}$-fmd);
the precursor being Nb(Me$_3$SiCp)$_2$(N$^{iBu}$-fmd);
the precursor being Nb(Me$_3$SiCp)$_2$(N$^{nBu}$-fmd);
the precursor being Nb(Me$_3$SiCp)$_2$(N$^{tBu}$-fmd);
the precursor being Nb(Me$_3$SiCp)$_2$(N$^{sBu}$-fmd);
the precursor being Nb(Me$_3$SiCp)$_2$(N$^{tAm}$-fmd);
the precursor being Nb(Me$_3$SiCp)$_2$(N$^{TMS}$-fmd);
the precursor being Nb(Me$_3$SiCp)$_2$(N$^{Et, tBu}$-fmd);
the precursor being Nb(Cp)(Cp*)(N$^{Me}$-fmd);
the precursor being Nb(Cp)(MeCp)(N$^{Et}$-fmd);
the precursor being Nb(Cp)(EtCp)(N$^{iPr}$-fmd);
the precursor being Nb(Cp)(iPrCp)(N$^{nPr}$-fmd);
the precursor being Nb(Cp)(nPrCp)(N$^{tBu}$-fmd);
the precursor being Nb(Cp)(iBuCp)(N$^{nBu}$-fmd);
the precursor being Nb(Cp)(tBuCp)(N$^{tBu}$-fmd);
the precursor being Nb(Cp)(tAmCp)(N$^{sBu}$-fmd);
the precursor being Nb(iPr$_3$Cp)(Cp)(N$^{Et}$-fmd);

L being amidinate (N$^{R, R'}$ R"-amd or N$^R$ R"-amd when R=R');

the precursor being Nb(Cp)$_2$(N$^{Me}$ Me-amd);
the precursor being Nb(Cp)$_2$(N$^{Et}$ Me-amd);
the precursor being Nb(Cp)$_2$(N$^{iPr}$ Me-amd);
the precursor being Nb(Cp)$_2$(N$^{nPr}$ Me-amd);
the precursor being Nb(Cp)$_2$(N$^{iBu}$ Me-amd);
the precursor being Nb(Cp)$_2$(N$^{nBu}$ Me-amd);
the precursor being Nb(Cp)$_2$(N$^{tBu}$ Me-amd);
the precursor being Nb(Cp)$_2$(N$^{sBu}$ Me-amd);
the precursor being Nb(Cp)$_2$(N$^{tAm}$ Me-amd);
the precursor being Nb(Cp)$_2$(N$^{TMS}$ Me-amd);
the precursor being Nb(Cp)$_2$(N$^{Et, tBu}$ Me-amd);
the precursor being Nb(MeCp)$_2$(N$^{Me}$ Me-amd);
the precursor being Nb(MeCp)$_2$(N$^{Et}$ Me-amd);
the precursor being Nb(MeCp)$_2$(N$^{iPr}$ Me-amd);
the precursor being Nb(MeCp)$_2$(N$^{nPr}$ Me-amd);
the precursor being Nb(MeCp)$_2$(N$^{iBu}$ Me-amd);
the precursor being Nb(MeCp)$_2$(N$^{nBu}$ Me-amd);
the precursor being Nb(MeCp)$_2$(N$^{tBu}$ Me-amd);

the precursor being Nb(MeCp)$_2$(N$^{sBu}$ Me-amd);
the precursor being Nb(MeCp)$_2$(N$^{tam}$ Me-amd);
the precursor being Nb(MeCp)$_2$(N$^{TMS}$ Me-amd);
the precursor being Nb(MeCp)$_2$(N$^{Et,\,tBu}$ Me-amd);
the precursor being Nb(EtCp)$_2$(N$^{Me}$ Me-amd);
the precursor being Nb(EtCp)$_2$(N$^{Et}$ Me-amd);
the precursor being Nb(EtCp)$_2$(N$^{iPr}$ Me-amd);
the precursor being Nb(EtCp)$_2$(N$^{nPr}$ Me-amd);
the precursor being Nb(EtCp)$_2$(N$^{iBu}$ Me-amd);
the precursor being Nb(EtCp)$_2$(N$^{nBu}$ Me-amd);
the precursor being Nb(EtCp)$_2$(N$^{tBu}$ Me-amd);
the precursor being Nb(EtCp)$_2$(N$^{sBu}$ Me-amd);
the precursor being Nb(EtCp)$_2$(N$^{tAm}$ Me-amd);
the precursor being Nb(EtCp)$_2$(N$^{TMS}$ Me-amd);
the precursor being Nb(EtCp)$_2$(N$^{Et,\,tBu}$ Me-amd);
the precursor being Nb(iPrCp)$_2$(N$^{Me}$ Me-amd);
the precursor being Nb(iPrCp)$_2$(N$^{Et}$ Me-amd);
the precursor being Nb(iPrCp)$_2$(N$^{iPr}$ Me-amd);
the precursor being Nb(iPrCp)$_2$(N$^{nPr}$ Me-amd);
the precursor being Nb(iPrCp)$_2$(N$^{iBu}$ Me-amd);
the precursor being Nb(iPrCp)$_2$(N$^{nBu}$ Me-amd);
the precursor being Nb(iPrCp)$_2$(N$^{tBu}$ Me-amd);
the precursor being Nb(iPrCp)$_2$(N$^{sBu}$ Me-amd);
the precursor being Nb(iPrCp)$_2$(N$^{tAm}$ Me-amd);
the precursor being Nb(iPrCp)$_2$(N$^{TMS}$ Me-amd);
the precursor being Nb(iPrCp)$_2$(N$^{Et,\,tBu}$ Me-amd);
the precursor being Nb(tBuCp)$_2$(N$^{Me}$ Me-amd);
the precursor being Nb(tBuCp)$_2$(N$^{Et}$ Me-amd);
the precursor being Nb(tBuCp)$_2$(N$^{iPr}$ Me-amd);
the precursor being Nb(tBuCp)$_2$(N$^{nPr}$ Me-amd);
the precursor being Nb(tBuCp)$_2$(N$^{iBu}$ Me-amd);
the precursor being Nb(tBuCp)$_2$(N$^{nBu}$ Me-amd);
the precursor being Nb(tBuCp)$_2$(N$^{tBu}$ Me-amd);
the precursor being Nb(tBuCp)$_2$(N$^{sBu}$ Me-amd);
the precursor being Nb(tBuCp)$_2$(N$^{tAm}$ Me-amd);
the precursor being Nb(tBuCp)$_2$(N$^{TMS}$ Me-amd);
the precursor being Nb(tBuCp)$_2$(N$^{Et,\,tBu}$ Me-amd);
the precursor being Nb(iPr$_3$Cp)$_2$(N$^{Me}$ Me-amd);
the precursor being Nb(iPr$_3$Cp)$_2$(N$^{Et}$ Me-amd);
the precursor being Nb(iPr$_3$Cp)$_2$(N$^{iPr}$ Me-amd);
the precursor being Nb(iPr$_3$Cp)$_2$(N$^{nPr}$ Me-amd);
the precursor being Nb(iPr$_3$Cp)$_2$(N$^{iBu}$ Me-amd);
the precursor being Nb(iPr$_3$Cp)$_2$(N$^{nBu}$ Me-amd);
the precursor being Nb(iPr$_3$Cp)$_2$(N$^{tBu}$ Me-amd);
the precursor being Nb(iPr$_3$Cp)$_2$(N$^{sBu}$ Me-amd);
the precursor being Nb(iPr$_3$Cp)$_2$(N$^{tAm}$ Me-amd);
the precursor being Nb(iPr$_3$Cp)$_2$(N$^{TMS}$ Me-amd);
the precursor being Nb(iPr$_3$Cp)$_2$(N$^{Et,\,tBu}$ Me-amd);
the precursor being Nb(Cp*)$_2$(N$^{Me}$ Me-amd);
the precursor being Nb(Cp*)$_2$(N$^{Et}$ Me-amd);
the precursor being Nb(Cp*)$_2$(N$^{iPr}$ Me-amd);
the precursor being Nb(Cp*)$_2$(N$^{nPr}$ Me-amd);
the precursor being Nb(Cp*)$_2$(N$^{iBu}$ Me-amd);
the precursor being Nb(Cp*)$_2$(N$^{nBu}$ Me-amd);
the precursor being Nb(Cp*)$_2$(N$^{tBu}$ Me-amd);
the precursor being Nb(Cp*)$_2$(N$^{sBu}$ Me-amd);
the precursor being Nb(Cp*)$_2$(N$^{tAm}$ Me-amd);
the precursor being Nb(Cp*)$_2$(N$^{TMS}$ Me-amd);
the precursor being Nb(Cp*)$_2$(N$^{Et,\,tBu}$ Me-amd);
the precursor being Nb(Me$_3$SiCp)$_2$(N$^{Me}$ Me-amd);
the precursor being Nb(Me$_3$SiCp)$_2$(N$^{Et}$ Me-amd);
the precursor being Nb(Me$_3$SiCp)$_2$(N$^{iPr}$ Me-amd);
the precursor being Nb(Me$_3$SiCp)$_2$(N$^{nPr}$ Me-amd);
the precursor being Nb(Me$_3$SiCp)$_2$(N$^{iBu}$ Me-amd);
the precursor being Nb(Me$_3$SiCp)$_2$(N$^{nBu}$ Me-amd);
the precursor being Nb(Me$_3$SiCp)$_2$(N$^{tBu}$ Me-amd);
the precursor being Nb(Me$_3$SiCp)$_2$(N$^{sBu}$ Me-amd);
the precursor being Nb(Me$_3$SiCp)$_2$(N$^{tAm}$ Me-amd);
the precursor being Nb(Me$_3$SiCp)$_2$(N$^{TMS}$ Me-amd);
the precursor being Nb(Me$_3$SiCp)$_2$(N$^{Et,\,tBu}$ Me-amd);
the precursor being Nb(Cp)(Cp*)(N$^{Me}$ Me-amd);
the precursor being Nb(Cp)(MeCp)(N$^{Et}$ Me-amd);
the precursor being Nb(Cp)(EtCp)(N$^{iPr}$ Me-amd);
the precursor being Nb(Cp)(iPrCp)(N$^{nPr}$ Me-amd);
the precursor being Nb(Cp)(nPrCp)(N$^{iBu}$ Me-amd); W the precursor being Nb(Cp)(iBuCp)(N$^{nBu}$ Me-amd);
the precursor being Nb(Cp)(tBuCp)(N$^{tBu}$ Me-amd);
the precursor being Nb(Cp)(tAmCp)(N$^{sBu}$ Me-amd);
the precursor being Nb(Cp)(iPr$_3$Cp)(N$^{iPr}$ Me-amd);
the precursor being Nb(Cp)$_2$(N$^{iPr}$ Et-amd);
the precursor being Nb(Cp)$_2$(N$^{iPr}$ nPr-amd);
the precursor being Nb(Cp)$_2$(N$^{iPr}$ iPr-amd);
the precursor being Nb(Cp)$_2$(N$^{iPr}$ nBu-amd);
the precursor being Nb(Cp)$_2$(N$^{iPr}$ tBu-amd);
the precursor being Nb(Cp)$_2$(N$^{iPr}$ sBu-amd);
the precursor being Nb(Cp)$_2$(N$^{iPr}$ iBu-amd);
the precursor being Nb(MeCp)$_2$(N$^{iPr}$ Et-amd);
the precursor being Nb(MeCp)$_2$(N$^{iPr}$ nPr-amd);
the precursor being Nb(MeCp)$_2$(N$^{iPr}$ iPr-amd);
the precursor being Nb(MeCp)$_2$(N$^{iPr}$ nBu-amd);
the precursor being Nb(MeCp)$_2$(N$^{iPr}$ tBu-amd);
the precursor being Nb(MeCp)$_2$(N$^{iPr}$ sBu-amd);
the precursor being Nb(MeCp)$_2$(N$^{iPr}$ iBu-amd);
the precursor being Nb(EtCp)$_2$(N$^{iPr}$ Et-amd);
the precursor being Nb(EtCp)$_2$(N$^{iPr}$ nPr-amd);
the precursor being Nb(EtCp)$_2$(N$^{iPr}$ iPr-amd);
the precursor being Nb(EtCp)$_2$(N$^{iPr}$ nBu-amd);
the precursor being Nb(EtCp)$_2$(N$^{iPr}$ tBu-amd);
the precursor being Nb(EtCp)$_2$(N$^{iPr}$ sBu-amd);
the precursor being Nb(EtCp)$_2$(N$^{iPr}$ iBu-amd);
the precursor being Nb(iPr$_3$Cp)$_2$(N$^{iPr}$ Et-amd);
the precursor being Nb(iPr$_3$Cp)$_2$(N$^{iPr}$ nPr-amd);
the precursor being Nb(iPr$_3$Cp)$_2$(N$^{iPr}$ iPr-amd);
the precursor being Nb(iPr$_3$Cp)$_2$(N$^{iPr}$ nBu-amd);
the precursor being Nb(iPr$_3$Cp)$_2$(N$^{iPr}$ tBu-amd); W the precursor being Nb(iPr$_3$Cp)$_2$(N$^{iPr}$ sBu-amd);
the precursor being Nb(iPr$_3$Cp)$_2$(N$^{iPr}$ iBu-amd);
L being guanidinate (N$^{R,\,R'}$, N$^{R'',\,R'''}$-gnd or N$^R$, N$^{R''}$-gnd when R=R' and R''=R''');
the precursor being Nb(Cp)$_2$(N$^{Me}$, N$^{Me}$-gnd);
the precursor being Nb(Cp)$_2$(N$^{Et}$, N$^{Me}$-gnd);
the precursor being Nb(Cp)$_2$(N$^{iPr}$, N$^{Me}$-gnd);
the precursor being Nb(Cp)$_2$(N$^{nPr}$, N$^{Me}$-gnd);
the precursor being Nb(Cp)$_2$(N$^{iBu}$, N$^{Me}$-gnd);
the precursor being Nb(Cp)$_2$(N$^{nBu}$, N$^{Me}$-gnd);
the precursor being Nb(Cp)$_2$(N$^{tBu}$, N$^{Me}$-gnd);
the precursor being Nb(Cp)$_2$(N$^{sBu}$, N$^{Me}$-gnd);
the precursor being Nb(Cp)$_2$(N$^{tAm}$, N$^{Me}$-gnd);
the precursor being Nb(Cp)$_2$(N$^{TMS}$, N$^{Me}$-gnd);
the precursor being Nb(Cp)$_2$(N$^{Et,\,tBu}$, N$^{Me}$-gnd);
the precursor being Nb(MeCp)$_2$(N$^{Me}$, N$^{Me}$-gnd);
the precursor being Nb(MeCp)$_2$(N$^{Et}$, N$^{Me}$-gnd);
the precursor being Nb(MeCp)$_2$(N$^{iPr}$, N$^{Me}$-gnd);
the precursor being Nb(MeCp)$_2$(N$^{nPr}$, N$^{Me}$-gnd);
the precursor being Nb(MeCp)$_2$(N$^{iBu}$, N$^{Me}$-gnd);
the precursor being Nb(MeCp)$_2$(N$^{nBu}$, N$^{Me}$-gnd);
the precursor being Nb(MeCp)$_2$(N$^{tBu}$, N$^{Me}$-gnd);
the precursor being Nb(MeCp)$_2$(N$^{sBu}$, N$^{Me}$-gnd);
the precursor being Nb(MeCp)$_2$(N$^{tAm}$, N$^{Me}$-gnd);
the precursor being Nb(MeCp)$_2$(N$^{TMS}$, N$^{Me}$-gnd);
the precursor being Nb(MeCp)$_2$(N$^{Et,\,tBu}$, N$^{Me}$-gnd);
the precursor being Nb(EtCp)$_2$(N$^{Me}$, N$^{Me}$-gnd);
the precursor being Nb(EtCp)$_2$(N$^{Et}$, N$^{Me}$-gnd);
the precursor being Nb(EtCp)$_2$(N$^{iPr}$, N$^{Me}$-gnd);

the precursor being Nb(EtCp)$_2$(N$^{nPr}$, N$^{Me}$-gnd);
the precursor being Nb(EtCp)$_2$(N$^{iBu}$, N$^{Me}$-gnd);
the precursor being Nb(EtCp)$_2$(N$^{nBu}$, N$^{Me}$-gnd);
the precursor being Nb(EtCp)$_2$(N$^{tBu}$, N$^{Me}$-gnd);
the precursor being Nb(EtCp)$_2$(N$^{sBu}$, N$^{Me}$-gnd);
the precursor being Nb(EtCp)$_2$(N$^{tAm}$, N$^{Me}$-gnd);
the precursor being Nb(EtCp)$_2$(N$^{TMS}$, N$^{Me}$-gnd);
the precursor being Nb(EtCp)$_2$(N$^{Et, tBu}$, N$^{Me}$-gnd);
the precursor being Nb(iPrCp)$_2$(N$^{Me}$, N$^{Me}$-gnd);
the precursor being Nb(iPrCp)$_2$(N$^{Et}$, N$^{Me}$-gnd);
the precursor being Nb(iPrCp)$_2$(N$^{iPr}$, N$^{Me}$-gnd);
the precursor being Nb(iPrCp)$_2$(N$^{nPr}$, N$^{Me}$-gnd);
the precursor being Nb(iPrCp)$_2$(N$^{iBu}$, N$^{Me}$-gnd);
the precursor being Nb(iPrCp)$_2$(N$^{nBu}$, N$^{Me}$-gnd);
the precursor being Nb(iPrCp)$_2$(N$^{tBu}$, N$^{Me}$-gnd);
the precursor being Nb(iPrCp)$_2$(N$^{sBu}$, N$^{Me}$-gnd);
the precursor being Nb(iPrCp)$_2$(N$^{tAm}$, N$^{Me}$-gnd);
the precursor being Nb(iPrCp)$_2$(N$^{TMS}$, N$^{Me}$-gnd);
the precursor being Nb(iPrCp)$_2$(N$^{Et, tBu}$, N$^{Me}$-gnd);
the precursor being Nb(tBuCp)$_2$(N$^{Me}$, N$^{Me}$-gnd);
the precursor being Nb(tBuCp)$_2$(N$^{Et}$, N$^{Me}$-gnd);
the precursor being Nb(tBuCp)$_2$(N$^{iPr}$, N$^{Me}$-gnd);
the precursor being Nb(tBuCp)$_2$(N$^{nPr}$, N$^{Me}$-gnd);
the precursor being Nb(tBuCp)$_2$(N$^{iBu}$, N$^{Me}$-gnd);
the precursor being Nb(tBuCp)$_2$(N$^{nBu}$, N$^{Me}$-gnd);
the precursor being Nb(tBuCp)$_2$(N$^{tBu}$, N$^{Me}$-gnd);
the precursor being Nb(tBuCp)$_2$(N$^{sBu}$, N$^{Me}$-gnd);
the precursor being Nb(tBuCp)$_2$(N$^{tAm}$, N$^{Me}$-gnd);
the precursor being Nb(tBuCp)$_2$(N$^{TMS}$, N$^{Me}$-gnd);
the precursor being Nb(tBuCp)$_2$(N$^{Et, tBu}$, N$^{Me}$-gnd);
the precursor being Nb(iPr$_3$Cp)$_2$(N$^{Me}$, N$^{Me}$-gnd);
the precursor being Nb(iPr$_3$Cp)$_2$(N$^{Et}$, N$^{Me}$-gnd);
the precursor being Nb(iPr$_3$Cp)$_2$(N$^{iPr}$, N$^{Me}$-gnd);
the precursor being Nb(iPr$_3$Cp)$_2$(N$^{nPr}$, N$^{Me}$-gnd);
the precursor being Nb(iPr$_3$Cp)$_2$(N$^{iBu}$, N$^{Me}$-gnd);
the precursor being Nb(iPr$_3$Cp)$_2$(N$^{nBu}$, N$^{Me}$-gnd);
the precursor being Nb(iPr$_3$Cp)$_2$(N$^{tBu}$, N$^{Me}$-gnd);
the precursor being Nb(iPr$_3$Cp)$_2$(N$^{sBu}$, N$^{Me}$-gnd);
the precursor being Nb(iPr$_3$Cp)$_2$(N$^{tAm}$, N$^{Me}$-gnd);
the precursor being Nb(iPr$_3$Cp)$_2$(N$^{TMS}$, N$^{Me}$-gnd);
the precursor being Nb(iPr$_3$C)$_2$(N$^{Et, tBu}$, N$^{Me}$-gnd);
the precursor being Nb(Cp*)$_2$(N$^{Me}$, N$^{Me}$-gnd);
the precursor being Nb(Cp*)$_2$(N$^{Et}$, N$^{Me}$-gnd);
the precursor being Nb(Cp*)$_2$(N$^{iPr}$, N$^{Me}$-gnd);
the precursor being Nb(Cp*)$_2$(N$^{nPr}$, N$^{Me}$-gnd);
the precursor being Nb(Cp*)$_2$(N$^{iBu}$, N$^{Me}$-gnd);
the precursor being Nb(Cp*)$_2$(N$^{nBu}$, N$^{Me}$-gnd);
the precursor being Nb(Cp*)$_2$(N$^{tBu}$, N$^{Me}$-gnd);
the precursor being Nb(Cp*)$_2$(N$^{sBu}$, N$^{Me}$-gnd);
the precursor being Nb(Cp*)$_2$(N$^{tAm}$, N$^{Me}$-gnd);
the precursor being Nb(Cp*)$_2$(N$^{TMS}$, N$^{Me}$-gnd);
the precursor being Nb(Cp*)$_2$(N$^{Et, tBu}$, N$^{Me}$-gnd);
the precursor being Nb(Me$_3$SiCp)$_2$(N$^{Me}$, N$^{Me}$-gnd);
the precursor being Nb(Me$_3$SiCp)$_2$(N$^{Et}$, N$^{Me}$-gnd);
the precursor being Nb(Me$_3$SiCp)$_2$(N$^{iPr}$, N$^{Me}$-gnd);
the precursor being Nb(Me$_3$SiCp)$_2$(N$^{nPr}$, N$^{Me}$-gnd);
the precursor being Nb(Me$_3$SiCp)$_2$(N$^{iBu}$, N$^{Me}$-gnd);
the precursor being Nb(Me$_3$SiCp)$_2$(N$^{nBu}$, N$^{Me}$-gnd);
the precursor being Nb(Me$_3$SiCp)$_2$(N$^{tBu}$, N$^{Me}$-gnd);
the precursor being Nb(Me$_3$SiCp)$_2$(N$^{sBu}$, N$^{Me}$-gnd);
the precursor being Nb(Me$_3$SiCp)$_2$(N$^{tAm}$, N$^{Me}$-gnd);
the precursor being Nb(Me$_3$SiCp)$_2$(N$^{TMS}$, N$^{Me}$-gnd);
the precursor being Nb(Me$_3$SiCp)$_2$(N$^{Et, tBu}$, N$^{Me}$-gnd);
the precursor being Nb(Cp)(iPr$_3$Cp)(N$^{Me}$, N$^{Me}$-gnd);
the precursor being Nb(Cp)(Cp*)(N$^{Me}$, N$^{Me}$-gnd);
the precursor being Nb(Cp)(MeCp)(N$^{Et}$, N$^{Me}$-gnd);
the precursor being Nb(Cp)(EtCp)(N$^{iPr}$, N$^{Me}$-gnd);
the precursor being Nb(Cp)(iPrCp)(N$^{nPr}$, N$^{Me}$-gnd);
the precursor being Nb(Cp)(nPrCp)(N$^{iBu}$, N$^{Me}$-gnd);
the precursor being Nb(Cp)(iBuCp)(N$^{nBu}$, N$^{Me}$-gnd);
the precursor being Nb(Cp)(tBuCp)(N$^{tBu}$, N$^{Me}$-gnd);
the precursor being Nb(Cp)(tAmCp)(N$^{sBu}$, N$^{Me}$-gnd);
the precursor being Nb(Cp)$_2$(N$^{iPr}$, N$^{Me, Et}$-gnd);
the precursor being Nb(Cp)$_2$(N$^{iPr}$, N$^{Et}$-gnd);
the precursor being Nb(Cp)$_2$(N$^{iPr}$, N$^{nPr}$-gnd);
the precursor being Nb(Cp)$_2$(N$^{iPr}$, N$^{iPr}$-gnd);
the precursor being Nb(MeCp)$_2$(N$^{iPr}$, N$^{Me, Et}$-gnd);
the precursor being Nb(MeCp)$_2$(N$^{iPr}$, N$^{Et}$-gnd);
the precursor being Nb(MeCp)$_2$(N$^{iPr}$, N$^{nPr}$-gnd);
the precursor being Nb(MeCp)$_2$(N$^{iPr}$, N$^{iPr}$-gnd);
the precursor being Nb(EtCp)$_2$(N$^{iPr}$, N$^{Me, Et}$-gnd);
the precursor being Nb(EtCp)$_2$(N$^{iPr}$, N$^{Et}$-gnd);
the precursor being Nb(EtCp)$_2$(N$^{iPr}$, N$^{nPr}$-gnd);
the precursor being Nb(EtCp)$_2$(N$^{iPr}$, N$^{iPr}$-gnd);
the Niobium Nitride film forming composition comprising between approximately 95.0% w/w and approximately 100.0% w/w of the precursor;
the Niobium Nitride film forming composition comprising between approximately 5% w/w and approximately 50% w/w of the precursor;
the Niobium Nitride film forming composition comprising between approximately 0.0% w/w and approximately 5.0% w/w impurities;
the Niobium Nitride film forming composition comprising between approximately 0.0% w/w and approximately 2.0% w/w impurities;
the Niobium Nitride film forming composition comprising between approximately 0.0% w/w and approximately 1.0% w/w impurities;
the impurities including carbodiimides; formamidine; amidine; guanidine; alkylamines; dialkylamines; alkylimines; cyclopentadiene; dicyclopentadiene; THF; ether; pentane; cyclohexane; heptanes; benzene; toluene; chlorinated metal compounds; lithium, sodium, or potassium formamidinate; lithium, sodium, or potassium amidinate; lithium, sodium, or potassium guanidinate; and lithium, sodium, or potassium cyclopentadienyl;
the Niobium Nitride film forming composition comprising between approximately 0.0% w/w and approximately 2.0% w/w carbodiimide impurities;
the Niobium Nitride film forming composition comprising between approximately 0.0% w/w and approximately 2.0% w/w alkylamine impurities;
the Niobium Nitride film forming composition comprising between approximately 0.0% w/w and approximately 2.0% w/w alkylimine impurities;
the Niobium Nitride film forming composition comprising between approximately 0.0% w/w and approximately 2.0% w/w cyclopentadiene impurities;
the Niobium Nitride film forming composition comprising between approximately 0.0% w/w and approximately 2.0% w/w dicyclopentadiene impurities;
the Niobium Nitride film forming composition comprising between approximately 0.0% w/w and approximately 2.0% w/w THF impurities;
the Niobium Nitride film forming composition comprising between approximately 0.0% w/w and approximately 2.0% w/w ether impurities;
the Niobium Nitride film forming composition comprising between approximately 0.0% w/w and approximately 2.0% w/w pentane impurities;

the Niobium Nitride film forming composition comprising between approximately 0.0% w/w and approximately 2.0% w/w cyclohexane impurities;
the Niobium Nitride film forming composition comprising between approximately 0.0% w/w and approximately 2.0% w/w heptanes impurities;
the Niobium Nitride film forming composition comprising between approximately 0.0% w/w and approximately 2.0% w/w benzene impurities;
the Niobium Nitride film forming composition comprising between approximately 0.0% w/w and approximately 2.0% w/w toluene impurities;
the Niobium Nitride film forming composition comprising between approximately 0.0% w/w and approximately 2.0% w/w chlorinated metal compound impurities;
the Niobium Nitride film forming composition comprising between approximately 0.0% w/w and approximately 2.0% w/w lithium, sodium, or potassium formamidinate impurities;
the Niobium Nitride film forming composition comprising between approximately 0.0% w/w and approximately 2.0% w/w lithium, sodium, or potassium amidinate impurities;
the Niobium Nitride film forming composition comprising between approximately 0.0% w/w and approximately 2.0% w/w lithium, sodium, or potassium guanidinate impurities;
the Niobium Nitride film forming composition comprising between approximately 0.0% w/w and approximately 2.0% w/w lithium, sodium, or potassium cyclopentadienyl impurities;
the Niobium Nitride film forming composition comprising between approximately 0 ppbw and approximately 1 ppmw metal impurities; the Niobium Nitride film forming composition comprising between approximately 0 ppbw and approximately 500 ppbw metal impurities;
the metal impurities including Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), and Zinc (Zn);
the Niobium Nitride film forming composition comprising between approximately 0 ppbw and approximately 500 ppbw Al impurities;
the Niobium Nitride film forming composition comprising between approximately 0 ppbw and approximately 500 ppbw As impurities;
the Niobium Nitride film forming composition comprising between approximately 0 ppbw and approximately 500 ppbw Ba impurities;
the Niobium Nitride film forming composition comprising between approximately 0 ppbw and approximately 500 ppbw Be impurities;
the Niobium Nitride film forming composition comprising between approximately 0 ppbw and approximately 500 ppbw Bi impurities;
the Niobium Nitride film forming composition comprising between approximately 0 ppbw and approximately 500 ppbw Cd impurities;
the Niobium Nitride film forming composition comprising between approximately 0 ppbw and approximately 500 ppbw Ca impurities;
the Niobium Nitride film forming composition comprising between approximately 0 ppbw and approximately 500 ppbw Cr impurities;
the Niobium Nitride film forming composition comprising between approximately 0 ppbw and approximately 500 ppbw Co impurities;
the Niobium Nitride film forming composition comprising between approximately 0 ppbw and approximately 500 ppbw Cu impurities;
the Niobium Nitride film forming composition comprising between approximately 0 ppbw and approximately 500 ppbw Ga impurities;
the Niobium Nitride film forming composition comprising between approximately 0 ppbw and approximately 500 ppbw Ge impurities;
the Niobium Nitride film forming composition comprising between approximately 0 ppbw and approximately 500 ppbw Hf impurities;
the Niobium Nitride film forming composition comprising between approximately 0 ppbw and approximately 500 ppbw Zr impurities;
the Niobium Nitride film forming composition comprising between approximately 0 ppbw and approximately 500 ppbw In impurities;
the Niobium Nitride film forming composition comprising between approximately 0 ppbw and approximately 500 ppbw Fe impurities;
the Niobium Nitride film forming composition comprising between approximately 0 ppbw and approximately 500 ppbw Pb impurities;
the Niobium Nitride film forming composition comprising between approximately 0 ppbw and approximately 500 ppbw Li impurities;
the Niobium Nitride film forming composition comprising between approximately 0 ppbw and approximately 500 ppbw Mg impurities;
the Niobium Nitride film forming composition comprising between approximately 0 ppbw and approximately 500 ppbw Mn impurities;
the Niobium Nitride film forming composition comprising between approximately 0 ppbw and approximately 500 ppbw W impurities;
the Niobium Nitride film forming composition comprising between approximately 0 ppbw and approximately 500 ppbw Ni impurities;
the Niobium Nitride film forming composition comprising between approximately 0 ppbw and approximately 500 ppbw K impurities;
the Niobium Nitride film forming composition comprising between approximately 0 ppbw and approximately 500 ppbw Na impurities;
the Niobium Nitride film forming composition comprising between approximately 0 ppbw and approximately 500 ppbw Sr impurities;
the Niobium Nitride film forming composition comprising between approximately 0 ppbw and approximately 500 ppbw Th impurities;
the Niobium Nitride film forming composition comprising between approximately 0 ppbw and approximately 500 ppbw Sn impurities;
the Niobium Nitride film forming composition comprising between approximately 0 ppbw and approximately 500 ppbw Ti impurities;

the Niobium Nitride film forming composition comprising between approximately 0 ppbw and approximately 500 ppbw U impurities; and the Niobium Nitride film forming composition comprising between approximately 0 ppbw and approximately 500 ppbw Zn impurities.

Also disclosed are processes for the deposition of Niobium Nitride films on substrates. The Niobium Nitride film forming composition(s) disclosed above is introduced into a reactor having a substrate disposed therein. At least part of the precursor is deposited onto the substrate to form the Niobium Nitride film. The disclosed processes may further include one or more of the following aspects:

introducing a reactant into the reactor;
the reactant being selected from the group consisting of $N_2$, $NH_3$, $N_2H_4$, radicals thereof; and mixtures thereof;
the Niobium Nitride precursor and the reactant being introduced into the reactor substantially simultaneously;
the reactor being configured for chemical vapor deposition;
the reactor being configured for plasma enhanced chemical vapor deposition;
the Niobium Nitride precursor and the reactant being introduced into the chamber sequentially;
the reactor being configured for atomic layer deposition; and
the reactor being configured for plasma enhanced atomic layer deposition.

BRIEF DESCRIPTION OF THE FIGURES

For a further understanding of the nature and objects of the present invention, reference should be made to the following detailed description, taken in conjunction with the accompanying figure wherein.

DESCRIPTION OF PREFERRED EMBODIMENTS

Figure 1:
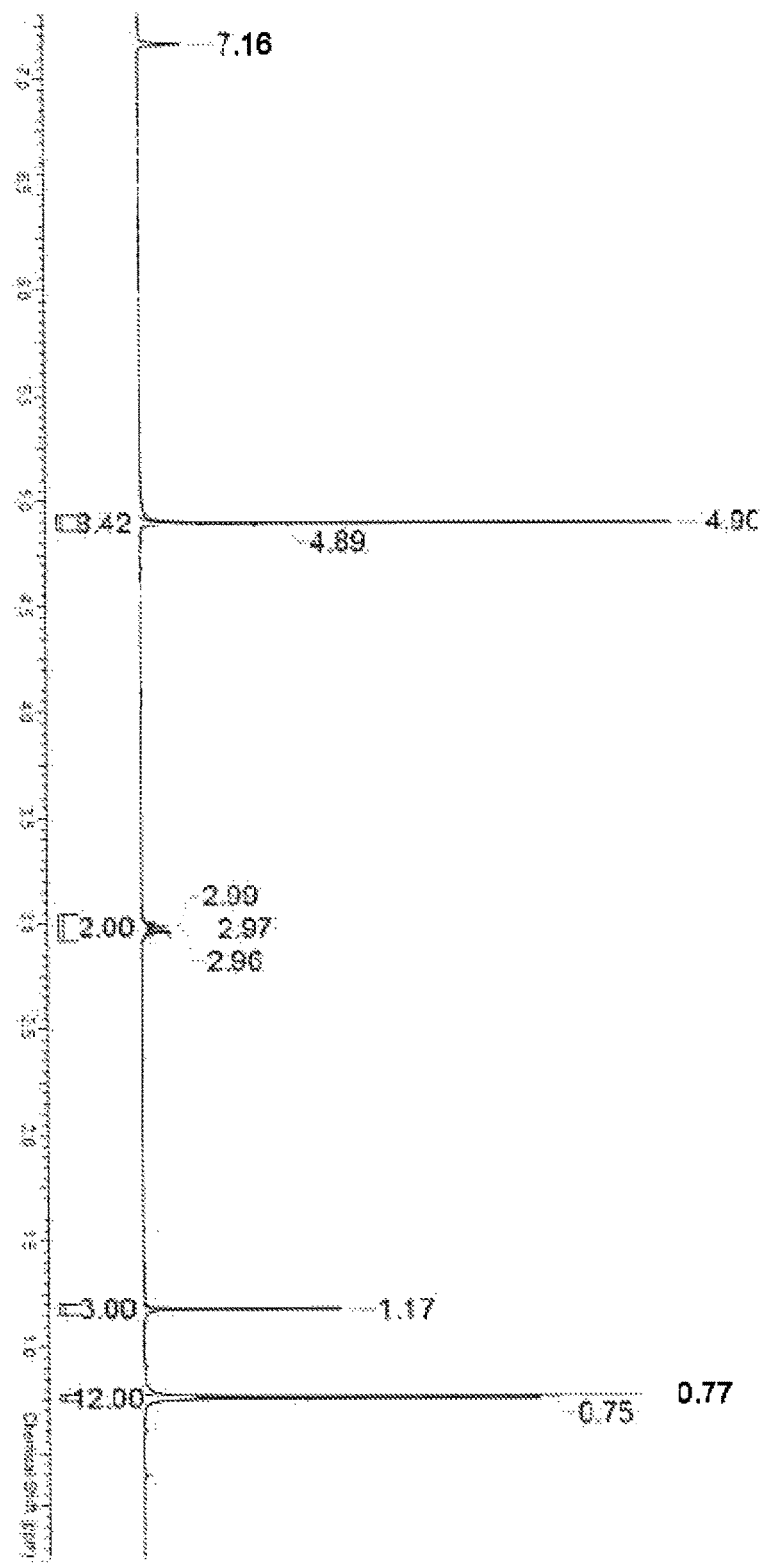
FIG. 1 is a $^1$HNMR spectrum of bis-cyclopentadienyl diisopropylacetamidinato Niobium [NbCp$_2$(N$^{iPr}$ Me-amd)]

Disclosed are Niobium Nitride film forming compositions comprising precursors having the formula:

wherein each R is independently H, an alkyl group, or R'$_3$Si, with each R' independently being H or an alkyl group; and L is selected from the group consisting of formamidinates (N$^{R,\ R'}$-fmd or N$^R$-fmd when R=R'), amidinates (N$^{R,\ R'}$ R"-amd or N$^R$ R"-amd when R=R'), and guanidinates (N$^{R,\ R'}$, N$^{R'',\ R'''}$-gnd or N$^R$, N$^{R''}$-gnd when R=R' and R"=R''').

The precursor may have the formula Nb(R$_5$Cp)$_2$(N$^R$, R'-fmd):

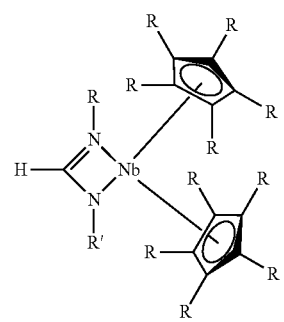

wherein each R and R' is independently H, a C1 to C6 alkyl group, or SiR"$_3$, with each R" independently being H or a C1 to C6 alkyl group. Preferably, each R and R' is independently H, Me, Et, nPr, iPr, tBu, sBu, iBu, nBu, tAmyl, SiMe$_3$, SiMe$_2$H, or SiH$_2$Me. When R=R' on the fmd ligand, the formula is Nb(R$_5$Cp)$_2$(N$^R$-fmd).

Exemplary precursors include Nb(Cp)$_2$(N$^{Me}$-fmd), Nb(Cp)$_2$(N$^{Et}$-fmd), Nb(Cp)$_2$(N$^{iPr}$-fmd), Nb(Cp)$_2$(N$^{nPr}$-fmd), Nb(Cp)$_2$(N$^{iBu}$-fmd), Nb(Cp)$_2$(N$^{nBu}$-fmd), Nb(Cp)$_2$(N$^{tBu}$-fmd), Nb(Cp)$_2$(N$^{sBu}$-fmd), Nb(Cp)$_2$(N$^{tAm}$-fmd), Nb(Cp)$_2$(N$^{TMS}$-fmd), Nb(MeCp)$_2$(N$^{Me}$-fmd), Nb(MeCp)$_2$(N$^{Et}$-fmd), Nb(MeCp)$_2$(N$^{iPr}$-fmd), Nb(MeCp)$_2$(N$^{nPr}$-fmd), Nb(MeCp)$_2$(N$^{iBu}$-fmd), Nb(MeCp)$_2$(N$^{nBu}$-fmd), Nb(MeCp)$_2$(N$^{tBu}$-fmd), Nb(MeCp)$_2$(N$^{sBu}$-fmd), Nb(MeCp)$_2$(N$^{tAm}$-fmd), Nb(MeCp)$_2$(N$^{TMS}$-fmd), Nb(EtCp)$_2$(N$^{Me}$-fmd), Nb(EtCp)$_2$(N$^{Et}$-fmd), Nb(EtCp)$_2$(N$^{iPr}$-fmd), Nb(EtCp)$_2$(N$^{nPr}$-fmd), Nb(EtCp)$_2$(N$^{iBu}$-fmd), Nb(EtCp)$_2$(N$^{nBu}$-fmd), Nb(EtCp)$_2$(N$^{tBu}$-fmd), Nb(EtCp)$_2$(N$^{sBu}$-fmd), Nb(EtCp)$_2$(N$^{tAm}$-fmd), Nb(EtCp)$_2$(N$^{TMS}$-fmd), Nb(iPrCp)$_2$(N$^{Me}$-fmd), Nb(iPrCp)$_2$(N$^{Et}$-fmd), Nb(iPrCp)$_2$(N$^{iPr}$-fmd), Nb(iPrCp)$_2$(nPr-fmd), Nb(iPrCp)$_2$(N$^{iBu}$-fmd), Nb(iPrCp)$_2$(N$^{nBu}$-fmd), Nb(iPrCp)$_2$(N$^{tBu}$-fmd), Nb(iPrCp)$_2$(N$^{sBu}$-fmd), Nb(iPrCp)$_2$(N$^{tAm}$-fmd), Nb(iPrCp)$_2$(N$^{TMS}$-fmd), Nb(tBuCp)$_2$(N$^{Me}$-fmd), Nb(tBuCp)$_2$(N$^{Et}$-fmd), Nb(tBuCp)$_2$(N$^{iPr}$-fmd), Nb(tBuCp)$_2$(N$^{nPr}$-fmd), Nb(tBuCp)$_2$(N$^{iBu}$-fmd), Nb(tBuCp)$_2$(N$^{tBu}$-fmd), Nb(tBuCp)$_2$(N$^{nBu}$-fmd), Nb(tBuCp)$_2$(N$^{tAm}$-fmd), Nb(tBuCp)$_2$(N$^{TMS}$-fmd), Nb(iPr$_3$Cp)$_2$(N$^{Me}$-fmd), Nb(iPr$_3$Cp)$_2$(N$^{Et}$-fmd), Nb(iPr$_3$Cp)$_2$(N$^{iPr}$-fmd), Nb(iPr$_3$Cp)$_2$(N$^{nPr}$-fmd), Nb(iPr$_3$Cp)$_2$(N$^{iBu}$-fmd), Nb(iPr$_3$Cp)$_2$(N$^{nBu}$-fmd), Nb(iPr$_3$Cp)$_2$(N$^{tBu}$-fmd), Nb(iPr$_3$Cp)$_2$(N$^{sBu}$-fmd), Nb(iPr$_3$Cp)$_2$(N$^{tAm}$-fmd), Nb(iPr$_3$Cp)$_2$(N$^{TMS}$-fmd), Nb(Cp*)$_2$(N$^{Me}$-fmd), Nb(Cp*)$_2$(N$^{Et}$-fmd), Nb(Cp*)$_2$(N$^{iPr}$-fmd), Nb(Cp*)$_2$(N$^{nPr}$-fmd), Nb(Cp*)$_2$(N$^{iBu}$-fmd), Nb(Cp*)$_2$(N$^{nBu}$-fmd), Nb(Cp*)$_2$(tBu-fmd), Nb(Cp*)$_2$(N$^{sBu}$-fmd), Nb(Cp*)$_2$(N$^{tAm}$-fmd), Nb(Cp*)$_2$(N$^{TMS}$-fmd), Nb(Me$_3$SiCp)$_2$(N$^{Me}$-fmd), Nb(Me$_3$SiCp)$_2$(N$^{Et}$-fmd), Nb(Me$_3$SiCp)$_2$(N$^{iPr}$-fmd), Nb(Me$_3$SiCp)$_2$(N$^{nPr}$-fmd), Nb(Me$_3$SiCp)$_2$(N$^{iBu}$-fmd), Nb(Me$_3$SiCp)$_2$(N$^{nBu}$-fmd), Nb(Me$_3$SiCp)$_2$(N$^{tBu}$-fmd), Nb(Me$_3$SiCp)$_2$(N$^{sBu}$-fmd), Nb(Me$_3$SiCp)$_2$(N$^{tAm}$-fmd), Nb(Me$_3$SiCp)$_2$(N$^{TMS}$-fmd), Nb(Cp)(Cp*)(N$^{Me}$-fmd), Nb(Cp)(iPr$_3$Cp)(N$^{Me}$-fmd), Nb(Cp)(MeCp)(N$^{Et}$-fmd), Nb(Cp)(EtCp)(N$^{iPr}$-fmd), Nb(Cp)(iPrCp)(N$^{nPr}$-fmd), Nb(Cp)(nPrCp)(N$^{iBu}$-fmd), Nb(Cp)(iBuCp)(N$^{nBu}$-fmd), Nb(Cp)(tBuCp)(N$^{tBu}$-fmd), Nb(Cp)(tAmCp)(N$^{sBu}$-fmd), Nb(Cp)$_2$(N$^{Et, tBu}$-fmd), Nb(MeCp)$_2$(N$^{Et, tBu}$-fmd), or Nb(EtCp)$_2$(N$^{Et, tBu}$-fmd).

These precursors may be synthesized by reacting Nb(R$_5$Cp)$_2$X$_2$ with two (2) equivalents of Z(N$^{R, R'}$-fmd) wherein X is an halogen selected from the group consisting of F, Cl, Br and I; Z is an alkali metal selected from the group consisting of Li, Na and K; and each R and R' is independently H, Me, Et, nPr, iPr, tBu, sBu, iBu, nBu, tAmyl, SiMe$_3$, SiMe$_2$H, or SiH$_2$Me. Nb(R$_5$Cp)$_2$X$_2$ may be prepared as described in J. C. S. Dalton 1980, 180-186. Z(N$^{R, R'}$-fmd) may be prepared by reaction of an alkyl alkali-metal, such as n-Butyl Lithium (nBuLi), with the corresponding formamidine molecule. The formamidine molecule may be prepared according to the procedure described in Organometallics 2004, 23, 3512-3520. The additions of the reactants may be done at low temperature, the temperature being below −50° C. The reaction may be done in a polar solvent, such as THF or diethylether. The precursor may be separated from alkali salts by extraction with a non polar solvent, such as pentane, hexane, cyclohexane, heptanes, benzene and toluene. The resulting Niobium Nitride film forming composition may be purified by vacuum sublimation, vacuum distillation or by recrystallisation in a suitable solvent selected without limitation from the group consisting of THF, diethylether, pentane, hexane, cyclohexane, heptanes, benzene, toluene, or mixtures thereof.

The precursor may have the formula Nb(R$_5$Cp)$_2$(N$^R$, R' R"-amd):

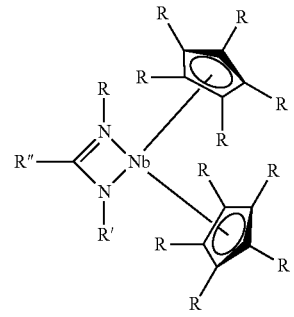

wherein each R, R' and R" is independently H, a C1 to C6 alkyl group, or SiR'"$_3$, with each R'" independently being H or a C1 to C6 alkyl group. Preferably, each R, R', or R" is independently H, Me, Et, nPr, iPr, tBu, sBu, iBu, nBu, tAmyl, SiMe$_3$, SiMe$_2$H, or SiH$_2$Me. When R=R' on the amidinate ligand, the formula is Nb(R$_5$Cp)$_2$(N$^R$ R"-amd).

Exemplary precursors include Nb(Cp)$_2$(N$^{Me}$ Me-amd), Nb(Cp)$_2$(N$^{Et}$ Me-amd), Nb(Cp)$_2$(N$^{iPr}$ Me-amd), Nb(Cp)$_2$(N$^{nPr}$ Me-amd), Nb(Cp)$_2$(N$^{iBu}$ Me-amd), Nb(Cp)$_2$(N$^{nBu}$ Me-amd), Nb(Cp)$_2$(N$^{tBu}$ Me-amd), Nb(Cp)$_2$(N$^{sBu}$ Me-amd), Nb(Cp)$_2$(N$^{tAm}$ Me-amd), Nb(Cp)$_2$(N$^{TMS}$ Me-amd), Nb(MeCp)$_2$(N$^{Me}$ Me-amd), Nb(MeCp)$_2$(N$^{Et}$ Me-amd), Nb(MeCp)$_2$(N$^{iPr}$ Me-amd), Nb(MeCp)$_2$(N$^{nPr}$ Me-amd), Nb(MeCp)$_2$(N$^{iBu}$ Me-amd), Nb(MeCp)$_2$(N$^{nBu}$ Me-amd), Nb(MeCp)$_2$(N$^{tBu}$ Me-amd), Nb(MeCp)$_2$(N$^{sBu}$ Me-amd), Nb(MeCp)$_2$(N$^{tAm}$ Me-amd), Nb(MeCp)$_2$(N$^{TMS}$ Me-amd), Nb(EtCp)$_2$(N$^{Me}$ Me-amd), Nb(EtCp)$_2$(N$^{Et}$ Me-amd), Nb(EtCp)$_2$(N$^{iPr}$ Me-amd), Nb(EtCp)$_2$(N$^{nPr}$ Me-amd), Nb(EtCp)$_2$(N$^{iBu}$ Me-amd), Nb(EtCp)$_2$(N$^{nBu}$ Me-amd), Nb(EtCp)$_2$(N$^{tBu}$ Me-amd), Nb(EtCp)$_2$(N$^{sBu}$ Me-amd), Nb(EtCp)$_2$(N$^{tAm}$ Me-amd), Nb(EtCp)$_2$(N$^{TMS}$ Me-amd), Nb(iPrCp)$_2$(N$^{Me}$ Me-amd), Nb(iPrCp)$_2$(N$^{Et}$ Me-amd), Nb(iPrCp)$_2$(N$^{iPr}$ Me-amd), Nb(iPrCp)$_2$(N$^{nPr}$ Me-amd), Nb(iPrCp)$_2$(N$^{iBu}$ Me-amd), Nb(iPrCp)$_2$(N$^{nBu}$ Me-amd), Nb(iPrCp)$_2$(N$^{tBu}$ Me-amd), Nb(iPrCp)$_2$(N$^{sBu}$ Me-amd), Nb(iPrCp)$_2$(N$^{tAm}$ Me-amd), Nb(iPrCp)$_2$(N$^{TMS}$ Me-amd), Nb(tBuCp)$_2$(N$^{Me}$ Me-amd), Nb(tBuCp)$_2$(N$^{Et}$ Me-amd), Nb(tBuCp)$_2$(N$^{iPr}$ Me-amd), Nb(tBuCp)$_2$(N$^{nPr}$ Me-amd), Nb(tBuCp)$_2$(N$^{iBu}$ Me-amd), Nb(tBuCp)$_2$(N$^{nBu}$ Me-amd), Nb(tBuCp)$_2$(N$^{tBu}$ Me-amd), Nb(tBuCp)$_2$(N$^{sBu}$ Me-amd), Nb(tBuCp)$_2$(N$^{tAm}$ Me-amd), Nb(tBuCp)$_2$(N$^{TMS}$ Me-amd), Nb(iPr$_3$Cp)$_2$(N$^{Me}$ Me-amd), Nb(iPr$_3$Cp)$_2$(N$^{Et}$ Me-amd), Nb(iPr$_3$Cp)$_2$(N$^{iPr}$ Me-amd), Nb(iPr$_3$Cp)$_2$(N$^{nPr}$ Me-amd), Nb(iPr$_3$Cp)$_2$(N$^{iBu}$ Me-amd), Nb(iPr$_3$Cp)$_2$(N$^{nBu}$ Me-amd), Nb(iPr$_3$Cp)$_2$(N$^{tBu}$ Me-amd), Nb(iPr$_3$Cp)$_2$(N$^{sBu}$ Me-amd), Nb(iPr$_3$Cp)$_2$(N$^{tAm}$ Me-amd), Nb(iPr$_3$Cp)$_2$(N$^{TMS}$ Me-amd), Nb(Cp*)$_2$(N$^{Me}$ Me-amd), Nb(Cp*)$_2$(N$^{Et}$ Me-amd), Nb(Cp*)$_2$(N$^{iPr}$ Me-amd), Nb(Cp*)$_2$(N$^{nPr}$ Me-amd), Nb(Cp*)$_2$(N$^{iBu}$ Me-amd), Nb(Cp*)$_2$($^{nBu}$ Me-amd), Nb(Cp*)$_2$(N$^{tBu}$ Me-amd), Nb(Cp*)$_2$(N$^{sBu}$ Me-amd), Nb(Cp*)$_2$(N$^{tAm}$ Me-amd), Nb(Cp*)$_2$(N$^{TMS}$ Me-amd), Nb(Me$_3$SiCp)$_2$(N$^{Me}$ Me-amd), Nb(Me$_3$SiCp)$_2$(N$^{Et}$ Me-amd), Nb(Me$_3$SiCp)$_2$(N$^{iPr}$ Me-amd), Nb(Me$_3$SiCp)$_2$(N$^{nPr}$ Me-amd), Nb(Me$_3$SiCp)$_2$(N$^{iBu}$ Me-amd), Nb(Me$_3$SiCp)$_2$(N$^{nBu}$ Me-amd), Nb(Me$_3$SiCp)$_2$(N$^{tBu}$ Me-amd), Nb(Me$_3$SiCp)$_2$(N$^{sBu}$ Me-amd), Nb(Me$_3$SiCp)$_2$(N$^{tAm}$ Me-amd), Nb(Me$_3$SiCp)$_2$(N$^{TMS}$ Me-amd), Nb(Cp)(Cp*)(N$^{Me}$ Me-amd), Nb(Cp)(iPr$_3$Cp)(N$^{Me}$ Me-amd), Nb(Cp)(MeCp)(N$^{Et}$ Me-amd), Nb(Cp)(EtCp)(N$^{iPr}$ Me-amd), Nb(Cp)(iPrCp)(N$^{nPr}$ Me-amd), Nb(Cp)(nPrCp)(N$^{iBu}$ Me-amd), Nb(Cp)(iBuCp)(N$^{nBu}$ Me-amd), Nb(Cp)(tBuCp)(N$^{tBu}$ Me-amd), Nb(Cp)(tAmCp)(N$^{sBu}$ Me-amd), Nb(Cp)$_2$(N$^{iPr}$ Et-amd), Nb(Cp)$_2$(N$^{iPr}$ nPr-amd), Nb(Cp)$_2$(N$^{iPr}$ iPr-amd), Nb(Cp)$_2$(N$^{iPr}$ tBu-amd), Nb(Cp)$_2$(N$^{iPr}$ nBu-amd), Nb(Cp)$_2$(N$^{iPr}$ iBu-amd), Nb(Cp)$_2$(N$^{iPr}$ sBu-amd), Nb(MeCp)$_2$(N$^{iPr}$ Et-amd), Nb(MeCp)$_2$(N$^{iPr}$ nPr-amd), Nb(MeCp)$_2$(N$^{iPr}$ iPr-amd), Nb(MeCp)$_2$(N$^{iPr}$ tBu-amd), Nb(MeCp)$_2$(N$^{iPr}$ nBu-amd), Nb(MeCp)$_2$(N$^{iPr}$ iBu-amd), Nb(MeCp)$_2$(N$^{iPr}$ sBu-amd), Nb(EtCp)$_2$(N$^{iPr}$ Et-amd), Nb(EtCp)$_2$(N$^{iPr}$ nPr-amd), Nb(EtCp)$_2$(N$^{iPr}$ iPr-amd), Nb(EtCp)$_2$(N$^{iPr}$ tBu-amd), Nb(EtCp)$_2$(N$^{iPr}$ nBu-amd), Nb(EtCp)$_2$(N$^{iPr}$ iBu-amd), or Nb(EtCp)$_2$(N$^{iP}$ sBu-amd).

These precursors may be synthesized by reacting Nb(R$_5$Cp)$_2$X$_2$ with two (2) equivalents of Z(N$^{R, R'}$ R"-amd) wherein X is an halogen selected from the group consisting of F, Cl, Br and I; Z is an alkali metal selected from the group consisting of Li, Na and K; and each R, R', and R" is independently H, Me, Et, nPr, iPr, tBu, sBu, iBu, nBu, tAmyl, SiMe$_3$, SiMe$_2$H, or SiH$_2$Me. Nb(R$_5$Cp)$_2$X$_2$ may be prepared as described in J. C. S. Dalton 1980, 180-186. Z(N$^{R, R'}$ R"-amd) may be prepared as described in Organometallics 1997, 16, 5183-5194. The additions of the reactants may be done at low temperature, the temperature being below –50° C. The reaction may be done in a polar solvent, such as THF and diethylether. The precursor may be separated from alkali salts by extraction with a non polar solvent, such as pentane, hexane, cyclohexane, heptanes, benzene and toluene. The resulting Niobium Nitride film forming composition may be purified either by vacuum sublimation, vacuum distillation or by recrystallisation in a suitable solvent, such as THF, diethylether, pentane, hexane, cyclohexane, heptanes, benzene, toluene, or mixtures thereof.

The precursor may have the formula Nb(R$_5$Cp)$_2$(N$^{R, R'}$ N$^{R'', R'''}$-gnd):

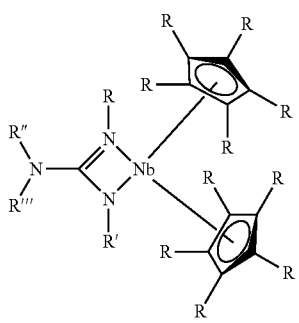

wherein each R, R', R" and R'" is independently H, a C1 to C6 alkyl group, or SiR'$_3$, wherein R' is H or a C1 to C6 alkyl group. Preferably, R, R', R", and R'" is independently H, Me, Et, nPr, iPr, tBu, sBu, iBu, nBu, tAmyl, SiMe$_3$, SiMe$_2$H, or SiH$_2$Me. When R=R' and R"=R'" on the guanidinate ligand, the formula is Nb(R$_5$Cp)$_2$(N$^R$, N$^{R'}$-gnd).

Exemplary precursors include Nb(Cp)$_2$(N$^{Me}$, N$^{Me}$-gnd), Nb(Cp)$_2$(N$^{Et}$, N$^{Me}$-gnd), Nb(Cp)$_2$(N$^{iPr}$, N$^{Me}$-gnd), Nb(Cp)$_2$(N$^{nPr}$, N$^{Me}$-gnd), Nb(Cp)$_2$(N$^{iBu}$, N$^{Me}$-gnd), Nb(Cp)$_2$(N$^{nBu}$, N$^{Me}$-gnd), Nb(Cp)$_2$(N$^{tBu}$, N$^{Me}$-gnd), Nb(Cp)$_2$(N$^{sBu}$, N$^{Me}$-gnd), Nb(Cp)$_2$(N$^{tAm}$, N$^{Me}$-gnd), Nb(Cp)$_2$(N$^{TMS}$, N$^{Me}$-gnd), Nb(MeCp)$_2$(N$^{Me}$, N$^{Me}$-gnd), Nb(MeCp)$_2$(N$^{Et}$, N$^{Me}$-gnd), Nb(MeCp)$_2$(N$^{iPr}$, N$^{Me}$-gnd), Nb(MeCp)$_2$(N$^{nPr}$, N$^{Me}$-gnd), Nb(MeCp)$_2$(N$^{iBu}$, N$^{Me}$-gnd), Nb(MeCp)$_2$(N$^{nBu}$, N$^{Me}$-gnd), Nb(MeCp)$_2$(N$^{tBu}$, N$^{Me}$-gnd), Nb(MeCp)$_2$(N$^{sBu}$, N$^{Me}$-gnd), Nb(MeCp)$_2$(N$^{tAm}$, N$^{Me}$-gnd), Nb(MeCp)$_2$(N$^{TMS}$, N$^{Me}$-gnd), Nb(EtCp)$_2$(N$^{Me}$, N$^{Me}$-gnd), Nb(EtCp)$_2$(N$^{Et}$, N$^{Me}$-gnd), Nb(EtCp)$_2$(N$^{iPr}$, N$^{Me}$-gnd), Nb(EtCp)$_2$(N$^{nPr}$, N$^{Me}$-gnd), Nb(EtCp)$_2$(N$^{iBu}$, N$^{Me}$-gnd), Nb(EtCp)$_2$(N$^{nBu}$, N$^{Me}$-gnd), Nb(EtCp)$_2$(N$^{tBu}$, N$^{Me}$-gnd), Nb(EtCp)$_2$(N$^{sBu}$, N$^{Me}$-gnd), Nb(EtCp)$_2$(N$^{tAm}$, N$^{Me}$-gnd), Nb(EtCp)$_2$(N$^{TMS}$, N$^{Me}$-gnd), Nb(iPrCp)$_2$(N$^{Me}$, N$^{Me}$-gnd), Nb(iPrCp)$_2$(N$^{Et}$, N$^{Me}$-gnd), Nb(iPrCp)$_2$(N$^{iPr}$, N$^{Me}$-gnd), Nb(iPrCp)$_2$(N$^{nPr}$, N$^{Me}$-gnd), Nb(iPrCp)$_2$(N$^{iBu}$, N$^{Me}$-gnd), Nb(iPrCp)$_2$(N$^{nBu}$, N$^{Me}$-gnd), Nb(iPrCp)$_2$(N$^{tBu}$, N$^{Me}$-gnd), Nb(iPrCp)$_2$(N$^{sBu}$, N$^{Me}$-gnd), Nb(iPrCp)$_2$(N$^{tAm}$, N$^{Me}$-gnd), Nb(iPrCp)$_2$(N$^{TMS}$, N$^{Me}$-gnd), Nb(tBuCp)$_2$(N$^{Me}$, N$^{Me}$-gnd), Nb(tBuCp)$_2$(N$^{Et}$, N$^{Me}$-gnd), Nb(tBuCp)$_2$(N$^{iPr}$, N$^{Me}$-gnd), Nb(tBuCp)$_2$(N$^{nPr}$, N$^{Me}$-gnd), Nb(tBuCp)$_2$(N$^{iBu}$, N$^{Me}$-gnd), Nb(tBuCp)$_2$(N$^{nBu}$, N$^{Me}$-gnd), Nb(tBuCp)$_2$(N$^{tBu}$, N$^{Me}$-gnd), Nb(tBuCp)$_2$(N$^{sBu}$, N$^{Me}$-gnd), Nb(tBuCp)$_2$(N$^{tAm}$, N$^{Me}$-gnd), Nb(tBuCp)$_2$(N$^{TMS}$, N$^{Me}$-gnd), Nb(iPr$_3$Cp)$_2$(N$^{Me}$, N$^{Me}$-gnd), Nb(iPr$_3$Cp)$_2$(N$^{Et}$, N$^{Me}$-gnd), Nb(iPr$_3$Cp)$_2$(N$^{iPr}$, N$^{Me}$-gnd), Nb(iPr$_3$Cp)$_2$(N$^{nPr}$, N$^{Me}$-gnd), Nb(iPr$_3$Cp)$_2$(N$^{iBu}$, N$^{Me}$-gnd), Nb(iPr$_3$Cp)$_2$(N$^{nBu}$, N$^{Me}$-gnd), Nb(iPr$_3$Cp)$_2$(N$^{tBu}$, N$^{Me}$-gnd), Nb(iPr$_3$Cp)$_2$(N$^{sBu}$, N$^{Me}$-gnd), Nb(iPr$_3$Cp)$_2$(N$^{tAm}$, N$^{Me}$-gnd), Nb(iPr$_3$Cp)$_2$(N$^{TMS}$, N$^{Me}$-gnd), Nb(Cp*)$_2$(N$^{Me}$, N$^{Me}$-gnd), Nb(Cp*)$_2$(N$^{Et}$, N$^{Me}$-gnd), Nb(Cp*)$_2$(N$^{iPr}$, N$^{Me}$-gnd), Nb(Cp*)$_2$(N$^{nPr}$, N$^{Me}$-gnd), Nb(Cp*)$_2$(N$^{iBu}$, N$^{Me}$-gnd), Nb(Cp*)$_2$(N$^{nBu}$, N$^{Me}$-gnd), Nb(Cp*)$_2$(tBu, N$^{Me}$-gnd), Nb(Cp*)$_2$(N$^{sBu}$, N$^{Me}$-gnd), Nb(Cp*)$_2$(N$^{tAm}$, N$^{Me}$-gnd), Nb(Cp*)$_2$(N$^{TMS}$, N$^{Me}$-gnd), Nb($^{Me}_3$SiCp)$_2$(N$^{Me}$, N$^{Me}$-gnd), Nb($^{Me}_3$SiCp)$_2$(N$^{Et}$, N$^{Me}$-gnd), Nb($^{Me}_3$SiCp)$_2$(N$^{iPr}$, N$^{Me}$w gnd), Nb($^{Me}_3$SiCp)$_2$(N$^{nPr}$, N$^{Me}$-gnd), Nb($^{Me}_3$SiCp)$_2$(N$^{iBu}$, N$^{Me}$-gnd), Nb($^{Me}_3$SiCp)$_2$(N$^{nBu}$, N$^{Me}$-gnd), Nb($^{Me}_3$SiCp)$_2$(N$^{tBu}$, N$^{Me}$-gnd), Nb($^{Me}_3$SiCp)$_2$(N$^{sBu}$, N$^{Me}$-gnd), Nb($^{Me}_3$SiCp)$_2$(N$^{tAm}$, N$^{Me}$-gnd), Nb($^{Me}_3$SiCp)$_2$(N$^{TMS}$, N$^{Me}$-gnd), Nb(Cp)(Cp*)(N$^{Me}$, N$^{Me}$-gnd), Nb(Cp)(iPr$_3$Cp)(N$^{Me}$, N$^{Me}$-gnd), Nb(Cp)(MeCp)(N$^{Et}$, N$^{Me}$-gnd), Nb(Cp)(EtCp)(N$^{iPr}$, N$^{Me}$-gnd), Nb(Cp)(iPrCp)(N$^{nPr}$, N$^{Me}$-gnd), Nb(Cp)(nPrCp)(N$^{iBu}$, N$^{Me}$-gnd), Nb(Cp)(iBuCp)(N$^{nBu}$, N$^{Me}$-gnd), Nb(Cp)(tBuCp)(N$^{tBu}$, N$^{Me}$-gnd), Nb(Cp)(tAmCp)(N$^{sBu}$, N$^{Me}$-gnd), Nb(Cp)$_2$(N$^{iPr}$, N$^{Me, Et}$-gnd), Nb(Cp)$_2$(N$^{iPr}$, N$^{Me, Et}$-gnd), Nb(Cp)$_2$(N$^{iPr}$, N$^{nPr}$-gnd), Nb(Cp)$_2$(N$^{iPr}$, N$^{iPr}$-gnd), Nb(MeCp)$_2$(N$^{iPr}$, N$^{Me, Et}$-gnd), Nb(MeCp)$_2$(N$^{iPr}$, N$^{Et}$-gnd), Nb(MeCp)$_2$(N$^{iPr}$, N$^{nPr}$-gnd), Nb(MeCp)$_2$(N$^{iPr}$, N$^{iPr}$-gnd), Nb(EtCp)$_2$(N$^{iPr}$, N$^{Me, Et}$-gnd), Nb(EtCp)$_2$(N$^{iPr}$, N$^{Et}$-gnd), Nb(EtCp)$_2$(N$^{iPr}$, N$^{nPr}$-gnd), or Nb(EtCp)$_2$(N$^{iPr}$, N$^{iPr}$-gnd).

These precursors may be synthesized by reacting Nb(R$_5$Cp)$_2$X$_2$ with two (2) equivalents of Z(N$^{R, R'}$, N$^{R'', R'''}$-gnd) wherein X is an halogen selected from the group consisting of F, Cl, Br and I; Z is an alkali metal selected from the group consisting of Li, Na and K; and each R, R', R" and R'" is independently H, Me, Et, nPr, iPr, tBu, sBu, iBu, nBu, tAmyl, SiMe$_3$, SiMe$_2$H, or SiH$_2$Me. Nb(R$_5$Cp)$_2$X$_2$ may be prepared as described in J. C. S. Dalton 1980, 180-186. Z(N$^{R, R'}$, N$^{R'', R'''}$ gnd) may be prepared as described in Organometallics 2008, 27, 1596-1604. The additions of the reactants may be done at low temperature, the temperature being below –50° C. The reaction may be done in a polar solvent, such as THF and diethylether. The precursor may be separated from alkali salts by extraction with a non polar solvent, such as pentane, hexane, cyclohexane, heptanes, benzene and toluene. The resulting Niobium Nitride film forming composition may be purified either by vacuum sublimation, vacuum distillation or by recrystallisation in a suitable solvent, such as THF, diethylether, pentane, hexane, cyclohexane, heptanes, benzene, toluene, or mixtures thereof.

Purity of the disclosed Niobium Nitride film forming composition is greater than 95% w/w (i.e., 95.0% w/w to 100.0% w/w), preferably greater than 98% w/w (i.e., 98.0% w/w to 100.0% w/w), and more preferably greater than 99% w/w (i.e., 99.0% w/w to 100.0% w/w). One of ordinary skill in the art will recognize that the purity may be determined by H NMR or gas or liquid chromatography with mass spectrometry. The disclosed Niobium Nitride film forming compositions may contain any of the following impurities: carbodiimides; alkylamines; dialkylamines; alkylimines; cyclopentadiene; dicyclopentadiene; THF; ether; pentane; cyclohexane; heptanes; benzene; toluene; chlorinated metal compounds; lithium, sodium, or potassium formamidinate; lithium, sodium, or potassium amidinate; lithium, sodium, or potassium guanidinate; or lithium, sodium, or potassium cyclopentadienyl. The total quantity of these impurities is below 5% w/w (i.e., 0.0% w/w to 5.0% w/w), preferably below 2% w/w (i.e., 0.0% w/w to 2.0% w/w), and more preferably below 1% w/w (i.e. 0.0% w/w to 1.0% w/w). The composition may be purified by recrystallisation, sublimation, distillation, and/or passing the gas or liquid through a suitable adsorbent, such as a 4 A molecular sieve.

Purification of the disclosed Niobium Nitride film forming composition may also result in metal impurities at the 0 ppbw to 1 ppmw, preferably 0-500 ppbw (part per billion weight) level. These metal impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), and Zinc (Zn).

Also disclosed are methods for forming Niobium Nitride layers on a substrate using a vapor deposition process. The method may be useful in the manufacture of semiconductor, photovoltaic, LCD-TFT, or flat panel type devices. The disclosed Niobium Nitride film forming compositions may be used to deposit Niobium Nitride films using any deposition methods known to those of skill in the art. Examples of suitable vapor deposition methods include chemical vapor deposition (CVD) or atomic layer deposition (ALD). Exemplary CVD methods include thermal CVD, plasma enhanced CVD (PECVD), pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

The disclosed Niobium Nitride film forming compositions may be supplied either in neat form or in a blend with a suitable solvent, such as ethyl benzene, xylene, mesitylene, decalin, decane, dodecane. The disclosed precursors may be present in varying concentrations in the solvent.

The neat or blended Niobium Nitride film forming compositions are introduced into a reactor in vapor form by conventional means, such as tubing and/or flow meters. The vapor form may be produced by vaporizing the neat or blended composition through a conventional vaporization step such as direct vaporization, distillation, or by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling the carrier gas into the composition. The carrier gas may include, but is not limited to, Ar, He, $N_2$, and mixtures thereof. Bubbling with a carrier gas may also remove any dissolved oxygen present in the neat or blended composition. The carrier gas and composition are then introduced into the reactor as a vapor.

If necessary, the container containing the disclosed composition may be heated to a temperature that permits the composition to be in its liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of precursor vaporized.

The reactor may be any enclosure or chamber within a device in which deposition methods take place such as without limitation, a parallel-plate type reactor, a cold-wall type reactor, a hot-wall type reactor, a single-wafer reactor, a multi-wafer reactor, or other types of deposition systems under conditions suitable to cause the compounds to react and form the layers. One of ordinary skill in the art will recognize that any of these reactors may be used for either ALD or CVD deposition processes.

The reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (Si-COH) layers, or combinations thereof. Additionally, the wafers may include copper layers or noble metal layers (e.g. platinum, palladium, rhodium, or gold). The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. The disclosed processes may deposit the Niobium Nitride layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. For example, a Niobium Nitride film may be deposited onto a Si layer. In subsequent processing, a zirconium oxide layer may be deposited on the Niobium Nitride layer, a second Niobium Nitride layer may be deposited on the zirconium oxide layer forming a $NbN/ZrO_2/NbN$ stack used in DRAM capacitors.

The temperature and the pressure within the reactor are held at conditions suitable for vapor depositions. In other words, after introduction of the vaporized composition into the chamber, conditions within the chamber are such that at least part of the precursor is deposited onto the substrate to form a Niobium Nitride film. For instance, the pressure in the reactor may be held between about 1 Pa and about 10 Pa, more preferably between about 25 Pa and about $10^3$ Pa, as required per the deposition parameters. Likewise, the temperature in the reactor may be held between about 100° C. and about 500° C., preferably between about 150° C. and about 400° C. One of ordinary skill in the art will recognize that "at least part of the precursor is deposited" means that some or all of the precursor reacts with or adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 100° C. to approximately 500° C. When a plasma deposition process is utilized, the deposition temperature may range from approximately 150° C. to approximately 400° C. Alternatively, when a thermal process is performed, the deposition temperature may range from approximately 200° C. to approximately 500° C.

In addition to the disclosed Niobium Nitride film forming composition, a reactant may be introduced into the reactor. The reactant may be $N_2$, $NH_3$, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, phenyl hydrazine, N-containing molecules, pyrazoline, radical species thereof, and mixtures thereof. Preferably, the reactant is $NH_3$.

The reactant may be treated by a plasma, in order to decompose the reactant into its radical form. $N_2$ may also be utilized as a nitrogen source gas when treated with plasma. For instance, the plasma may be generated with a power ranging from about 50 W to about 500 W, preferably from about 100 W to about 400 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

For example, the reactant may be introduced into a direct plasma reactor, which generates plasma in the reaction chamber, to produce the plasma-treated reactant in the reaction chamber. Exemplary direct plasma reactors include the Titan™ PECVD System produced by Trion Technologies. The reactant may be introduced and held in the reaction chamber prior to plasma processing. Alternatively, the plasma processing may occur simultaneously with the introduction of the reactant. In-situ plasma is typically a 13.56 MHz RF inductively coupled plasma that is generated between the showerhead and the substrate holder. The substrate or the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the reactant using in-situ plasma is typically less than achieved using a remote plasma source for the same power input and is therefore not as efficient in reactant disassociation as a remote plasma system, which may be beneficial for the deposition of Niobium Nitride films on substrates easily damaged by plasma.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant $O_2$ may be decomposed into two $O^-$ radicals. Preferably, the remote plasma may be generated with a power ranging from about 1 kW to about 10 kW, more preferably from about 2.5 kW to about 7.5 kW.

The vapor deposition conditions within the chamber allow the disclosed composition and the reactant to react and form a Niobium Nitride film on the substrate. In some embodiments, Applicants believe that plasma-treating the reactant may provide the reactant with the energy needed to react with the disclosed composition.

Depending on what type of film is desired to be deposited, an additional precursor compound may be introduced into the reactor. The precursor may be used to provide additional elements to the Niobium Nitride film. The additional elements may include lanthanides (Ytterbium, Erbium, Dysprosium, Gadolinium, Praseodymium, Cerium, Lanthanum, Yttrium), zirconium, germanium, silicon, magnesium, titanium, manganese, ruthenium, bismuth, lead, magnesium, aluminum, or mixtures of these. When an additional precursor compound is utilized, the resultant film deposited on the substrate contains the Niobium metal in combination with an additional element.

The Niobium Nitride film forming composition and reactants may be introduced into the reactor either simultaneously (chemical vapor deposition), sequentially (atomic layer deposition) or different combinations thereof. The reactor may be purged with an inert gas between the introduction of the compositions and the introduction of the reactants. Alternatively, the reactants and the compositions may be mixed together to form a reactant/composition mixture, and then introduced to the reactor in mixture form. Another example is to introduce the reactant continuously and to introduce the Niobium Nitride film forming composition by pulse (pulsed chemical vapor deposition).

The vaporized composition and the reactant may be pulsed sequentially or simultaneously (e.g. pulsed CVD) into the reactor. Each pulse of composition may last for a time period ranging from about 0.01 seconds to about 10 seconds, alternatively from about 0.3 seconds to about 3 seconds, alternatively from about 0.5 seconds to about 2 seconds. In another embodiment, the reactant may also be pulsed into the reactor. In such embodiments, the pulse of each may last for a time period ranging from about 0.01 seconds to about 10 seconds, alternatively from about 0.3 seconds to about 3 seconds, alternatively from about 0.5 seconds to about 2 seconds. In another alternative, the vaporized compositions and reactants may be simultaneously sprayed from a shower head under which a susceptor holding several wafers is spun (spatial ALD).

Depending on the particular process parameters, deposition may take place for a varying length of time. Generally, deposition may be allowed to continue as long as desired or necessary to produce a film with the necessary properties. Typical film thicknesses may vary from several angstroms to several hundreds of microns, depending on the specific deposition process. The deposition process may also be performed as many times as necessary to obtain the desired film.

In one non-limiting exemplary CVD process, the vapor phase of the disclosed Niobium Nitride film forming composition and a reactant are simultaneously introduced into the reactor. The two react to form the resulting Niobium Nitride film. When the reactant in this exemplary CVD process is treated with a plasma, the exemplary CVD process becomes an exemplary PECVD process. The reactant may be treated with plasma prior or subsequent to introduction into the chamber.

In one non-limiting exemplary ALD process, the vapor phase of the disclosed Niobium Nitride film forming composition is introduced into the reactor, where it is contacted with a suitable substrate. Excess composition may then be removed from the reactor by purging and/or evacuating the reactor. A reactant (for example, $NH_3$) is introduced into the reactor where it reacts with the absorbed composition in a self-limiting manner. Any excess reactant is removed from the reactor by purging and/or evacuating the reactor. If the desired film is a Niobium Nitride, this two-step process may provide the desired film thickness or may be repeated until a film having the necessary thickness has been obtained.

Alternatively, if the desired film contains the Niobium transition metal and a second element, the two-step process above may be followed by introduction of the vapor of an additional precursor compound into the reactor. The additional precursor compound will be selected based on the nature of the Niobium Nitride film being deposited. After introduction into the reactor, the additional precursor compound is contacted with the substrate. Any excess precursor compound is removed from the reactor by purging and/or evacuating the reactor. Once again, a reactant may be introduced into the reactor to react with the precursor compound. Excess reactant is removed from the reactor by purging and/or evacuating the reactor. If a desired film thickness has been achieved, the process may be terminated. However, if a thicker film is desired, the entire four-step process may be repeated. By alternating the provision of the Niobium Nitride film forming composition, additional precursor compound, and reactant, a film of desired composition and thickness can be deposited.

When the reactant in this exemplary ALD process is treated with a plasma, the exemplary ALD process becomes an exemplary PEALD process. The reactant may be treated with plasma prior or subsequent to introduction into the chamber.

In a second non-limiting exemplary ALD process, the vapor phase of one of the disclosed Niobium Nitride film forming composition, for example Niobium bis(ethyicyclopentadienyl) diisopropylamidinate ($Nb(EtCp)_2(N^{iPr}Me$-amd)), is introduced into the reactor, where it is contacted with a Si substrate. Excess composition may then be removed from the reactor by purging and/or evacuating the reactor. A reactant (for example, $NH_3$) is introduced into the reactor where it reacts with the absorbed composition in a self-limiting manner to form a Niobium Nitride film. Any excess $NH_3$ gas is removed from the reactor by purging and/or evacuating the reactor. These two steps may be repeated until the Niobium Nitride film obtains a desired thickness, typically around 10 angstroms. $ZrO_2$ may then be deposited on the NbN film. For example, $ZrCp(NMe_2)_3$ may serve as the Zr precursor. The second non-limiting exemplary ALD process described above using $Nb(EtCp)_2(N^{iPr}Me$-amd) and $NH_3$ may then be repeated on the $ZrO_2$ layer. The resulting $NbN/ZrO_2/NbN$ stack may be used in DRAM capacitors.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the NbN film may be exposed to a temperature ranging from approximately 200° C. and approximately 1000° C. for a time ranging from approximately 0.1 second to approximately 7200 seconds under an inert atmosphere, a N-containing atmosphere, or combinations thereof. Most preferably, the temperature is 400° C. for 3600 seconds under an inert atmosphere or a N-containing atmosphere. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the NbN film. This in turn tends to improve the resistivity of the film.

After annealing, the Niobium Nitride films deposited by any of the disclosed processes may have a bulk resistivity at room temperature of approximately 50 µohm·cm to approximately 1,000 µohm·cm. Room temperature is approximately 200° C. to approximately 28° C. depending on the season. Bulk resistivity is also known as volume resistivity. One of ordinary skill in the art will recognize that the bulk resistivity is measured at room temperature on NbN films that are typically approximately 50 nm thick. The bulk resistivity typically increases for thinner films due to changes in the electron transport mechanism. The bulk resistivity also increases at higher temperatures.

EXAMPLES

The following non-limiting examples are provided to further illustrate embodiments of the invention. However, the examples are not intended to be all inclusive and are not intended to limit the scope of the inventions described herein.

Example 1: Bis-Cyclopentadienyl Diisopropylacetamidinato Niobium Synthesis ($NbCp_2(N^{iPr}Me$-amd))

To a solution of diisopropyl carbodiimide (2.0 g, 16 mmol) in ca. 20 mL of THF at −78° C., was added dropwise MeLi (10 mL, 16 mmol). After stirring 3 h at room temperature, the mixture was added to a solution of $Nb(Cp)_2(Cl)_2$ (2.32 g, 7.9 mmol) in ca. 20 mL of THF at −78° C. The mixture was stirred overnight at room temperature. Solvent was then removed under vacuum and the product was extracted with toluene to give a black solid. The material was then purified by sublimation up to 190° C. @ 20 mTorr to give 1.08 g (37%) of pure black solid. The NMR $^1$H spectrum is provided in FIG. 1. $NMR^1H$ (δ, ppm, C6D6): 4.90 (s, 8H), 2.97 (m, 2H), 1.17 (s, 3H), 0.75 (d, 12H).

Figure 2:
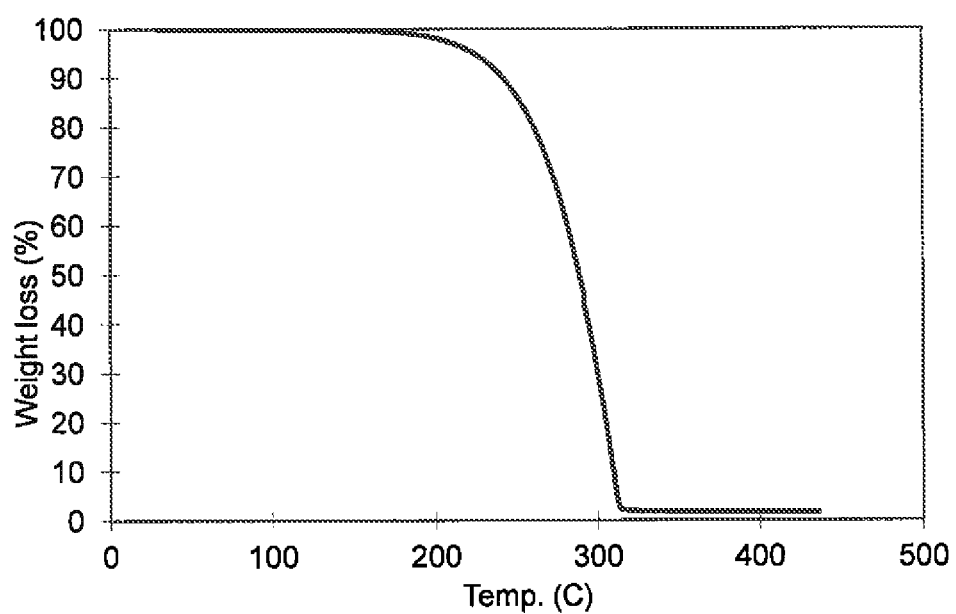
FIG. 2 is a ThermoGravimetric Analysis (TGA) graph demonstrating the percentage of weight loss with increasing temperature of NbCp$_2$(N$^{iPr}$ Me-amd)

The solid left a 1.7% residual mass during Open-Cup TGA analysis measured at a temperature rising rate of 10° C./min in an atmosphere which flows nitrogen at 200 mL/min (15% during Close-Cup). These results are shown in FIG. 2, which is a TGA graph illustrating the percentage of weight loss upon temperature increase.

Example 2: Bis-Cyclopentadienyl Diisopropylvaleramidinato Niobium Synthesis ($NbCp_2(N^{iPr}nBu$-amd))

To a solution of diisopropyl carbodiimide (50.5 g, 0.4 mol) in ca. 200 mL of THF at −78° C., was added dropwise nBuLi (250 mL, 0.4 mol). After stirring 12 h at room temperature, the mixture was added to a solution of $Nb(Cp)_2(Cl)_2$ (58.8 g, 0.2 mol) in ca. 200 mL of THF at −78°

Figure 3:
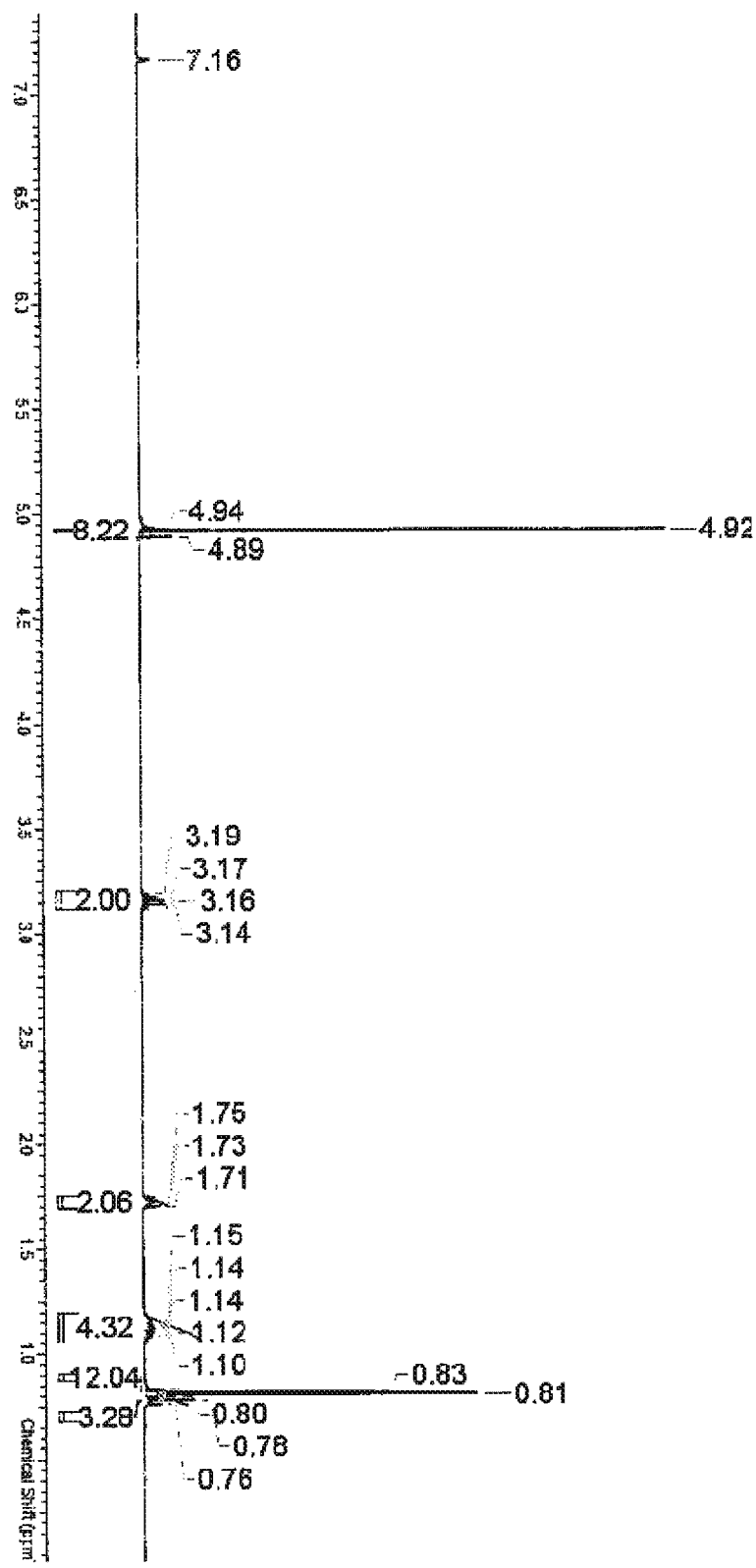
FIG. 3 is a $^1$HNMR spectrum of bis-cyclopentadienyl diisopropylvaleramidinato Niobium [NbCp$_2$(N$^{iPr}$ nBu-amd)]

C. The mixture was stirred overnight at room temperature. Solvent was then removed under vacuum and the product was extracted with toluene to give a black solid. The material was then purified by sublimation up to 150° C. @ 10 mTorr to give 37.85 g (46%) of pure black solid. The NMR $^1$H spectrum is provided in FIG. 3. NMR$^1$H (δ, ppm, C6D6): 4.92 (s, 8H), 3.16 (m, 2H), 1.73 (m, 2H), 1.13 (m, 4H), 0.81 (d, 12H), 0.78 (t, 3H).

Figure 4:
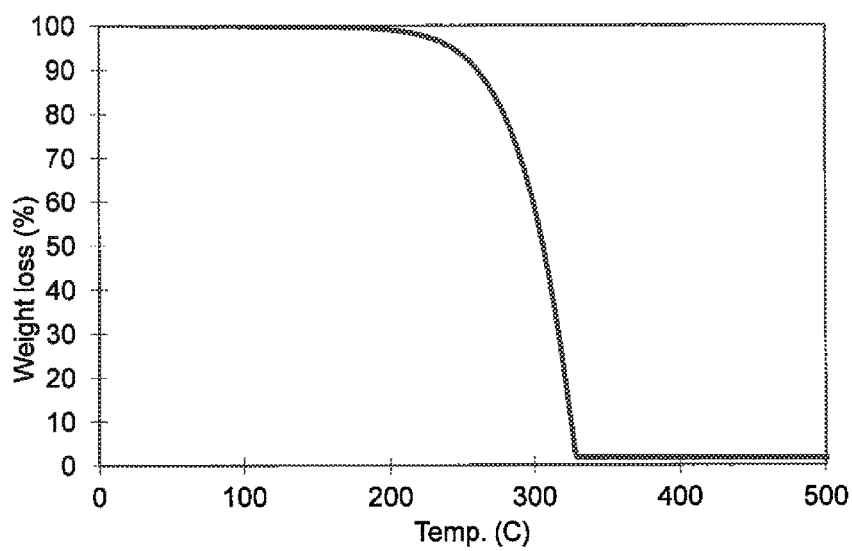
FIG. 4 is a TGA graph demonstrating the percentage of weight loss with increasing temperature of NbCp$_2$(N$^{iPr}$ nBu-amd)

The solid left a 1.7% residual mass during Open-Cup TGA analysis measured at a temperature rising rate of 10° C./min in an atmosphere which flows nitrogen at 200 mL/min (22% during Close-Cup). These results are shown in FIG. 4, which is a TGA graph illustrating the percentage of weight loss upon temperature increase.

Example 3: ALD of NbN Using NbCp$_2$(N$^{iPr}$ nBu-amd)

Pyrolysis and ALD tests were performed using NbCp$_2$(N$^{iPr}$ nBu-amd), which was be placed in a vessel heated up to 155° C. and NH$_3$ as co-reactant.

Figure 5:
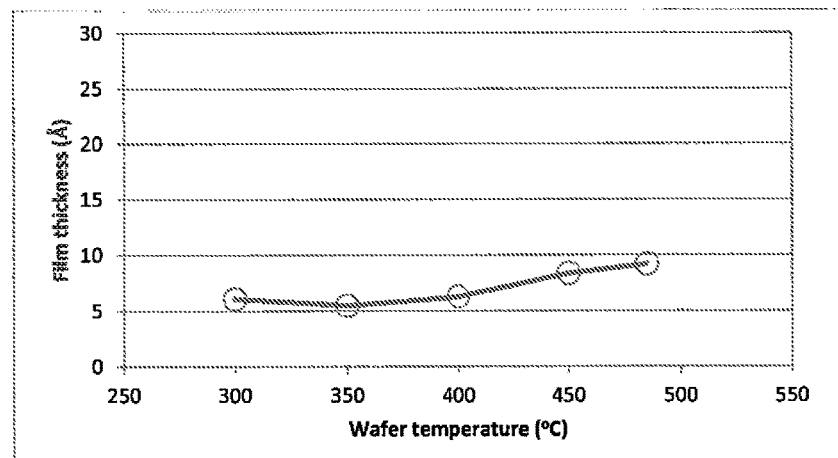
FIG. 5 is a graph showing the growth rates of the NbN films using NbCp$_2$(N$^{iPr}$ nBu-amd) without co-reactant between 300° C. and 450° C.

Pyrolysis tests were first performed with a reactor pressure fixed at ~0.5 Torr by flowing vapors of NbCp$_2$(N$^{iPr}$ nBu-amd) on the silicon wafer without co-reactant for a given time. FIG. 5 shows growth rates of the films using NbCp$_2$(N$^{iPr}$ nBu-amd) without co-reactant between 300 and 450° C. Thicknesses of the films are negligible up to 400° C. demonstrating excellent thermal stability of the vapors of NbCp$_2$(N$^{iPr}$ nBu-amd) up to 400° C. Above 400° C. some residual amount of material deposited on the wafers revealed the thermal self decomposition of the precursor.

Figure 6:
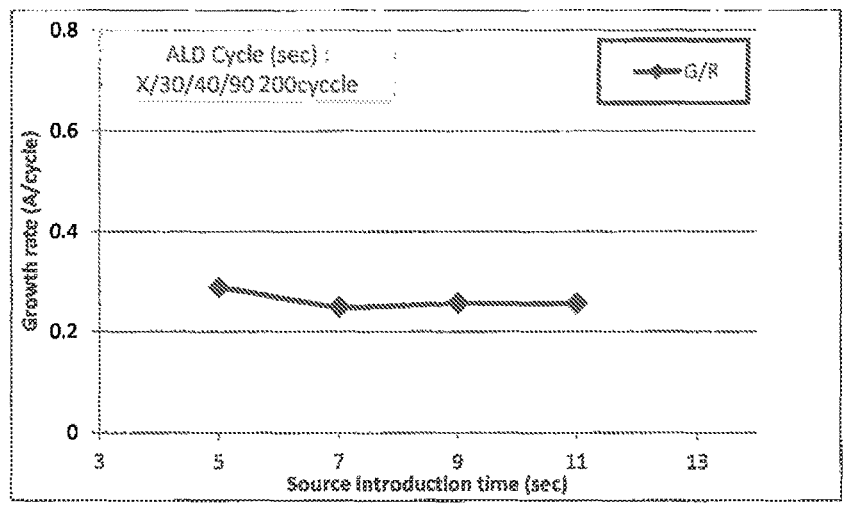
FIG. 6 is a graph showing the NbN film growth rate as a function of the precursor source introduction time at 350° C. using NbCp$_2$(N$^{iPr}$ nBu-amd)
Figure 7:
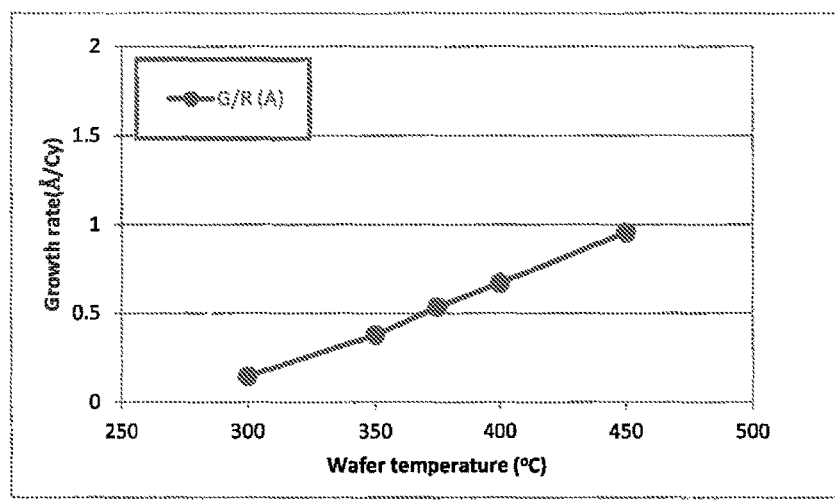
FIG. 7 is a graph showing the NbN film growth rate as a function of the chamber temperature using NbCp$_2$(N$^{iPr}$ nBu-amd)
Figure 8:
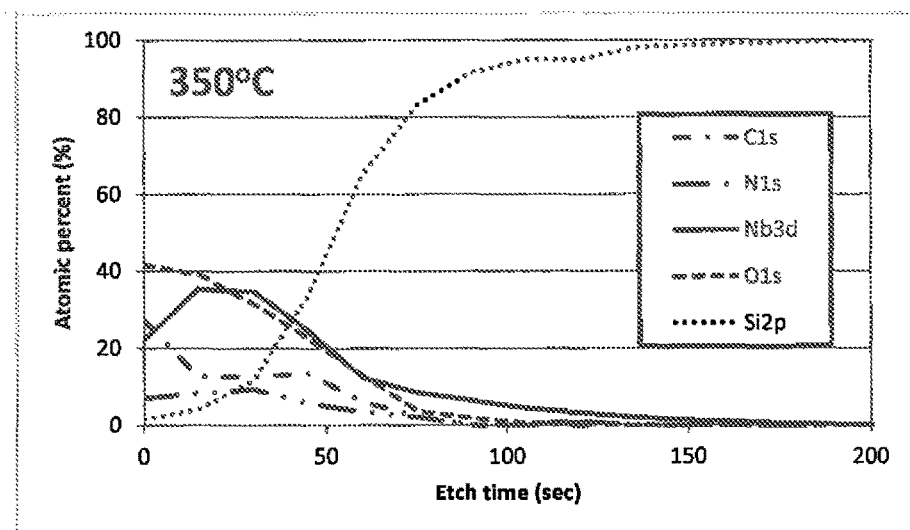
FIG. 8 is a graph showing the X-ray Photoelectron Spectroscopy (XPS) analysis of the films produced at 350° C. using NbCp$_2$(N$^{iPr}$ nBu-amd)
Figure 9:
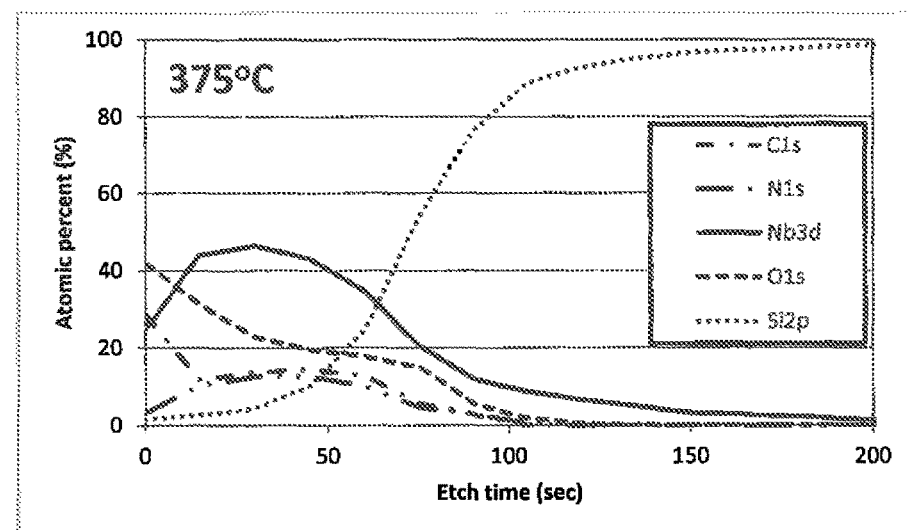
FIG. 9 is a graph showing the XPS analysis of the films produced at 375° C. using NbCp$_2$(N$^{iPr}$ nBu-amd)

Typical ALD conditions were used with a reactor pressure fixed at ~2 Torr and using NH$_3$ as the co-reactant. ALD behavior with complete surface saturation and reaction was confirmed at 350° C. on pure silicon wafers. FIG. 6 shows the NbN film growth rate remains stable at ~0.26 A/Cy as the precursor source introduction time is increase. The growth rates were assessed in the temperature range 300 to 450° C. FIG. 7 shows the ALD growth rates are in the range 0.2-0.6 Å/cycle. FIG. 8 and FIG. 9 show the X-ray Photoelectron Spectroscopy (XPS) analysis of the films produced at respectively at 350 and 375° C.

Example 4: Bis-Methylcyclopentadienyl Diisopropylacetamidinato Niobium Synthesis (Nb(MeCp)$_2$ (N$^{iPr}$ Me-amd))

Figure 10:
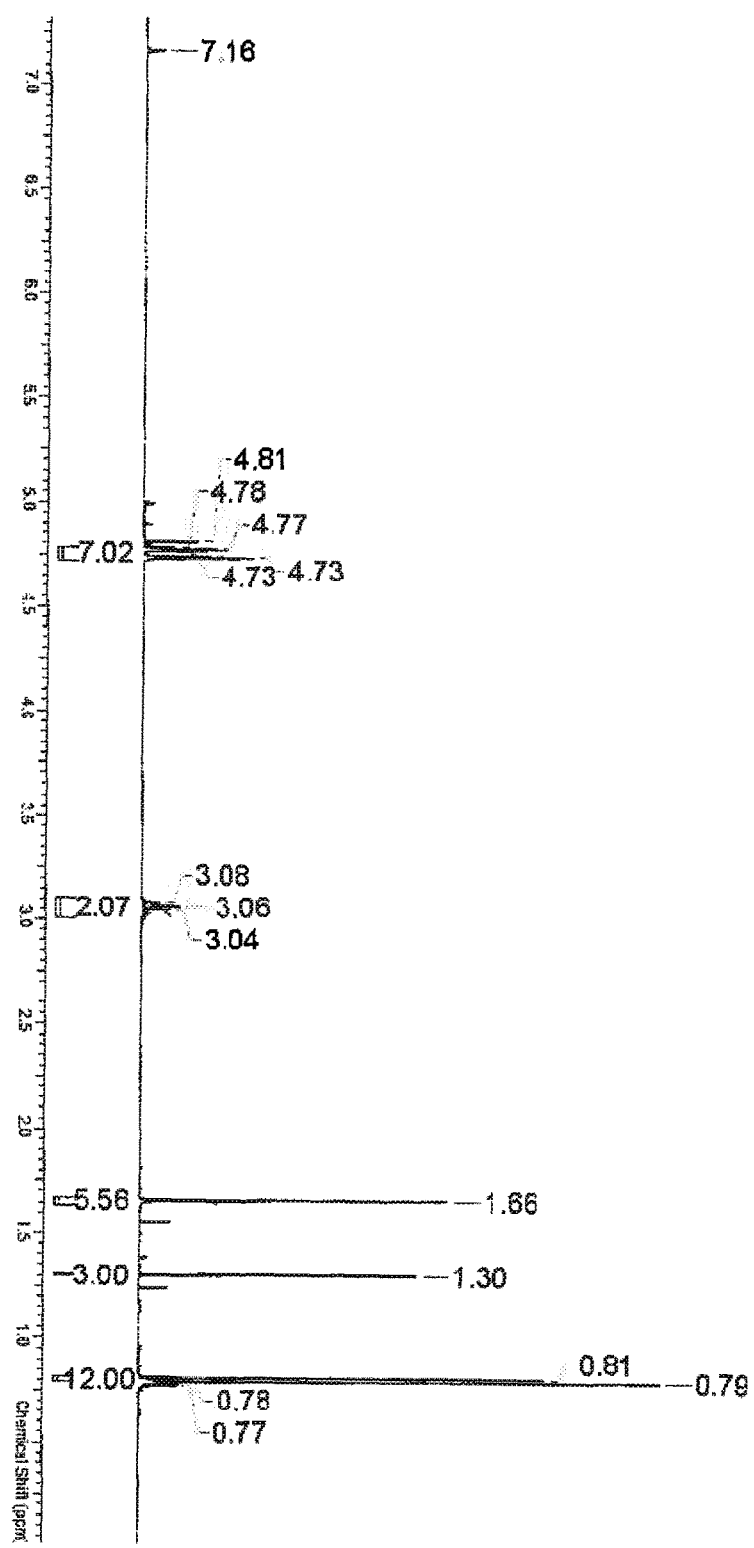
FIG. 10 is a $^1$HNMR spectrum of bis-methylcyclopentadienyl diisopropylacetamidinato Niobium [Nb(MeCp)$_2$(N$^{iPr}$ Me-amd)]

To a solution of diisopropyl carbodiimide (1.5 g, 11.9 mmol) in ca. 20 mL of THF at −78° C., was added dropwise MeLi (7.4 mL, 11.9 mmol). After stirring 3 h at room temperature, the mixture was added to a solution of Nb(MeCp)$_2$(Cl)$_2$ (2.32 g, 5.9 mmol) in ca. 20 mL of THF at −78° C. The mixture was stirred overnight at room temperature. Solvent was then removed under vacuum and the product was extracted with toluene to give a dark oil. The material was then purified by distillation up to 220° C. @ 20 mTorr (head up to 84° C.) to give 0.80 g (34%) of dark wax. The NMR $^1$H spectrum is provided in FIG. 10. NMR$^1$H (δ, ppm, C6D6): 4.73-4.78 (m, 8H), 3.06 (m, 2H), 1.66 (s, 6H), 1.30 (s, 3H), 0.79 (d, 12H).

Figure 11:
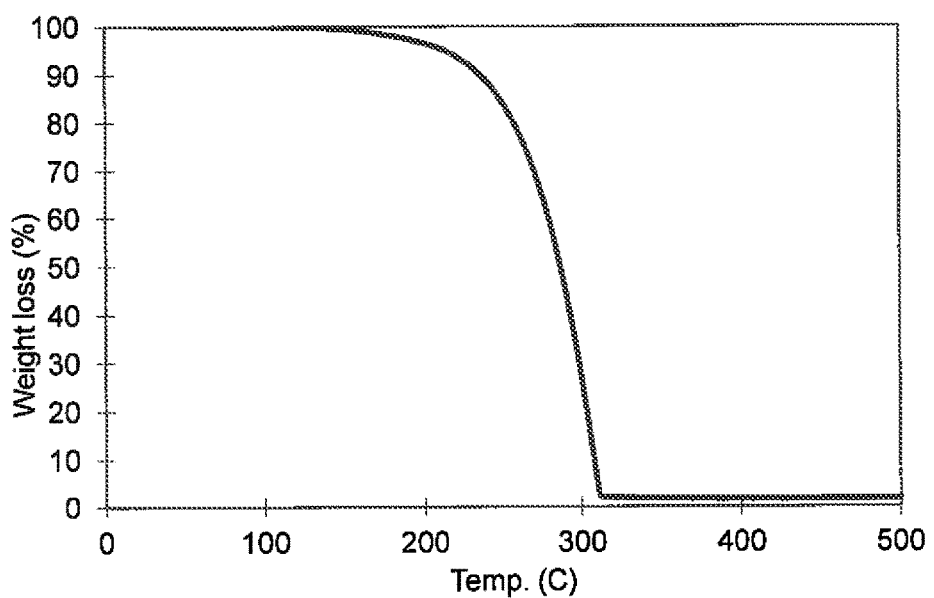
FIG. 11 is a TGA graph demonstrating the percentage of weight loss with increasing temperature of Nb(MeCp)$_2$(N$^{iPr}$ Me-amd)

The solid left a 1.7% residual mass during Open-Cup TGA analysis measured at a temperature rising rate of 10° C./min in an atmosphere which flows nitrogen at 200 mL/min (17% during Close-Cup). These results are shown in FIG. 11, which is a TGA graph illustrating the percentage of weight loss upon temperature increase.

Example 5: Bis-Methylcyclopentadienyl Diisopropylvaleramidinato Niobium Synthesis (Nb(MeCp)$_2$ (N$^{iPr}$ nBu-amd))

Figure 12:
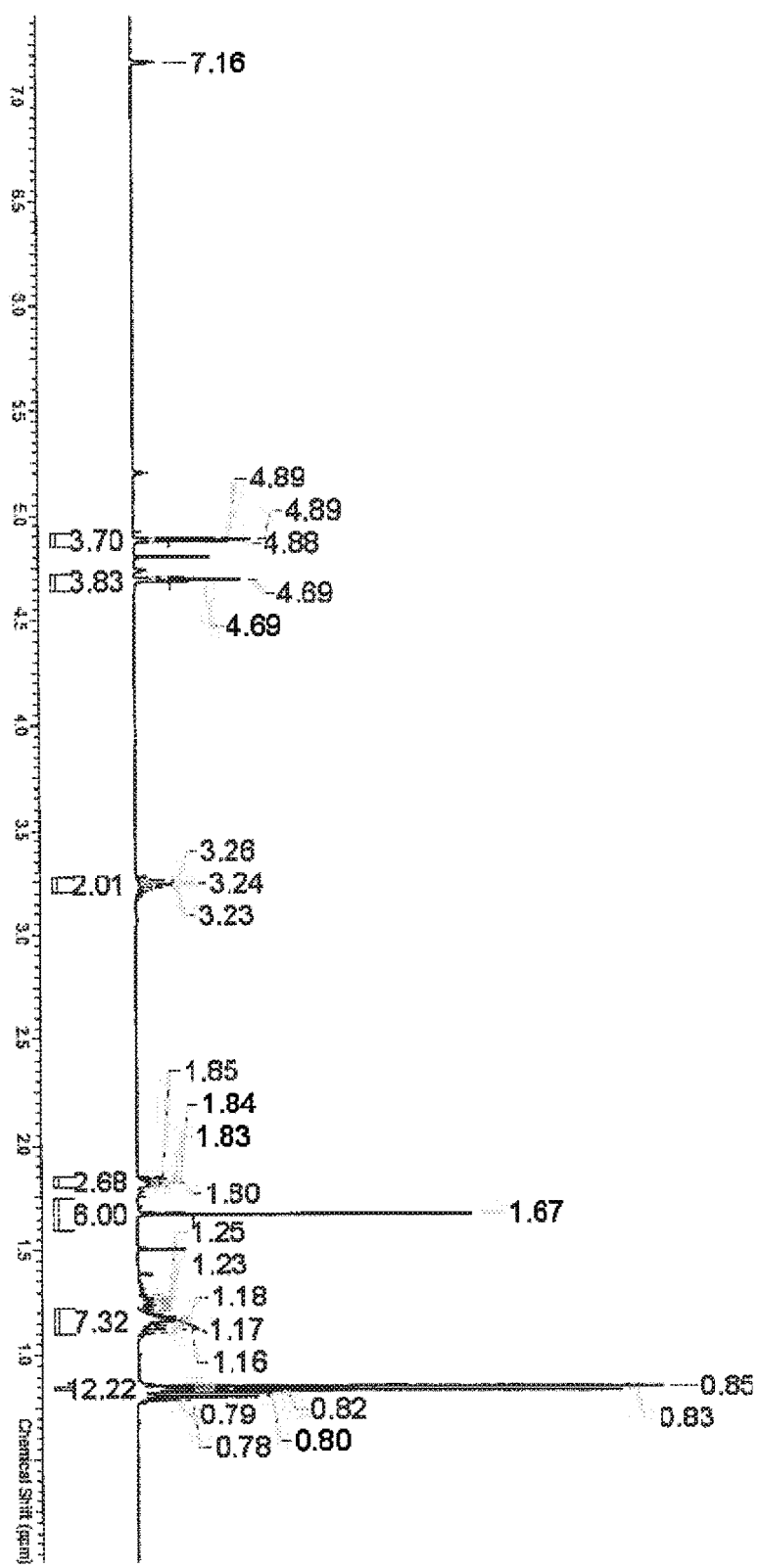
FIG. 12 is a $^1$HNMR spectrum bis-methylcyclopentadienyl diisopropylvaleramidinato Niobium [Nb(MeCp)$_2$(N$^{iPr}$ nBu-amd)]

To a solution of diisopropyl carbodiimide (1.5 g, 11.9 mmol) in ca. 20 mL of THF at −78° C., was added dropwise nBuLi (7.4 mL, 11.9 mmol). After stirring 3 h at room temperature, the mixture was added to a solution of Nb(MeCp)$_2$(Cl)$_2$ (2.32 g, 5.9 mmol) in ca. 20 mL of THF at −78° C. The mixture was stirred overnight at room temperature. Solvent was then removed under vacuum and the product was extracted with toluene to give a black oil. The material was then purified by distillation up to 210° C. @ 30 mTorr (head up to 60° C.) to give a black oil. The NMR $^1$H spectrum is provided in FIG. 12. NMR$^1$H (δ, ppm, C6D6): 4.69-4.89 (m, 8H), 3.24 (m, 2H), 1.81 (m, 2H), 1.67 (s, 6H), 1.17 (m, 4H), 0.83 (d, 12H), 0.80 (t, 3H).

Figure 13:
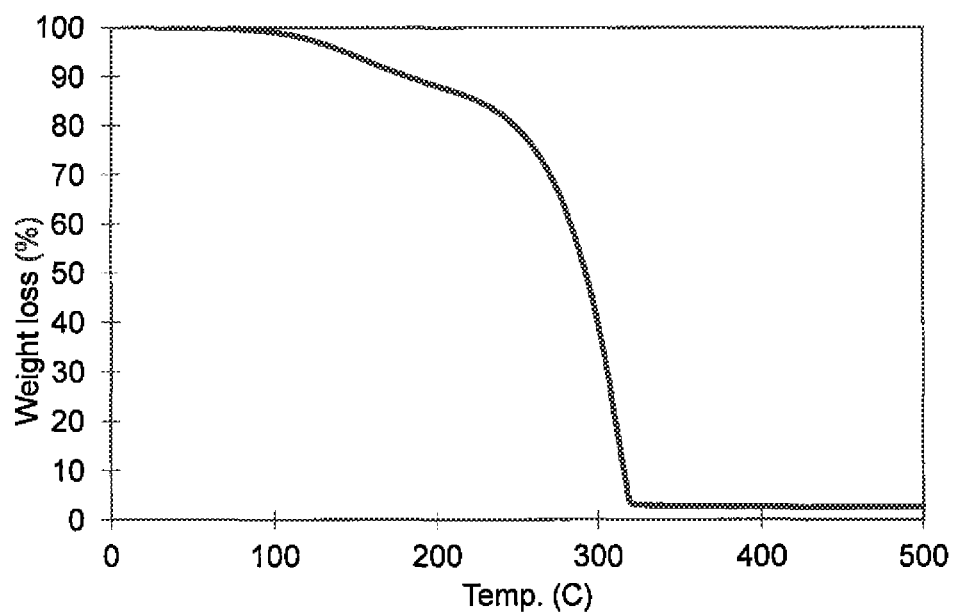
FIG. 13 is a TGA graph demonstrating the percentage of weight loss with increasing temperature of Nb(MeCp)$_2$(N$^{iPr}$ nBu-amd)

The solid left a 2.7% residual mass during Open-Cup TGA analysis measured at a temperature rising rate of 10° C./min in an atmosphere which flows nitrogen at 200 mL/min (24% during Close-Cup). These results are shown in FIG. 13, which is a TGA graph illustrating the percentage of weight loss upon temperature increase.

Example 6: Bis-Methylcyclopentadienyl t-Butyl, Ethylacetamidinato Niobium Synthesis (Nb(MeCp)$_2$ (N$^{tBu, Et}$ Me-amd))

Figure 14:
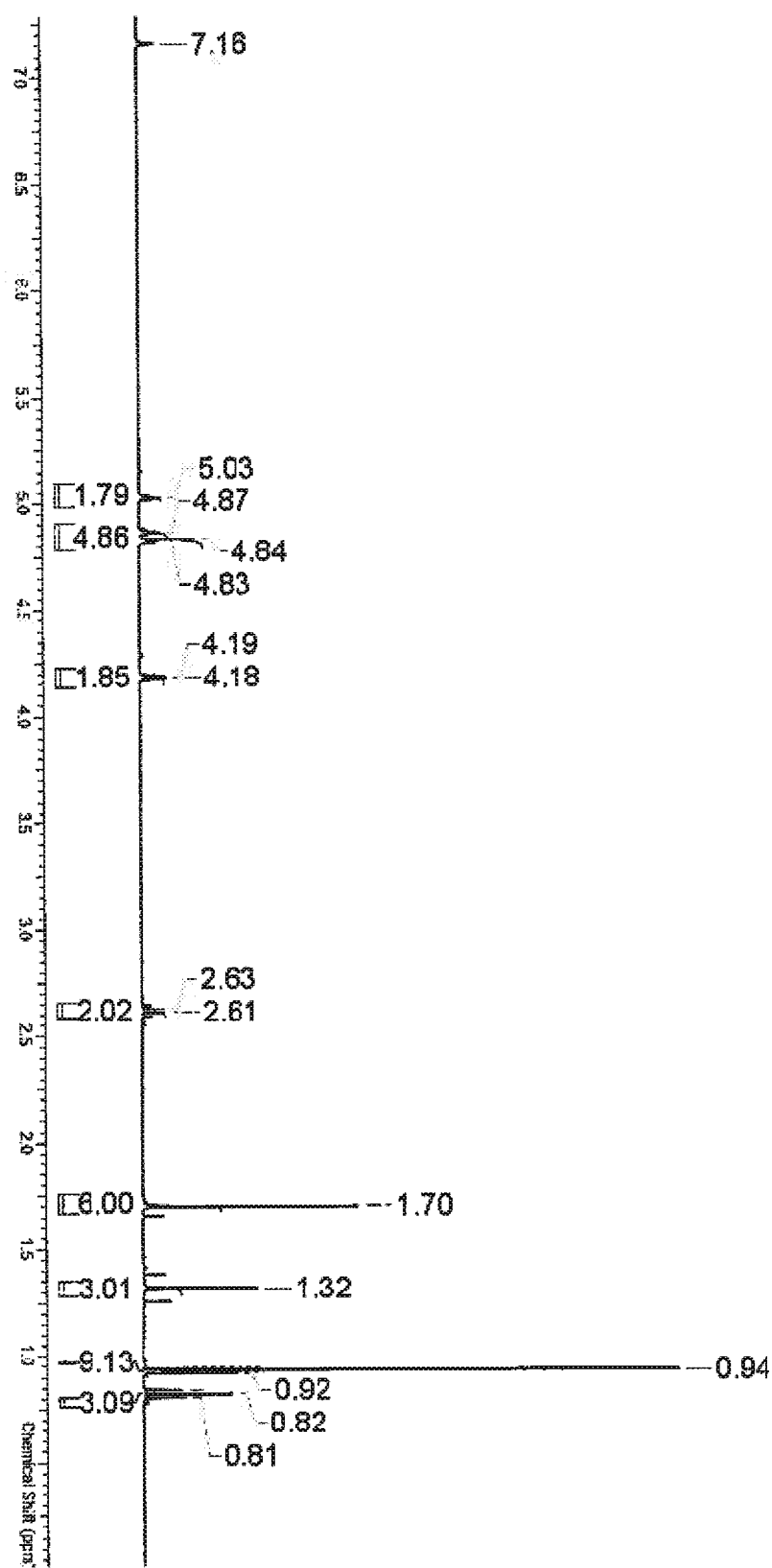
FIG. 14 is a $^1$HNMR spectrum bis-methylcyclopentadienyl t-butyl, ethylacetamidinato Niobium [Nb(MeCp)$_2$(N$^{tBu,\ Et}$Me-amd)]

To a solution of n-butylethyl carbodiimide (1.5 g, 11.9 mmol) in ca. 20 mL of THF at −78° C., was added dropwise MeLi (7.4 mL, 11.9 mmol). After stirring 3 h at room temperature, the mixture was added to a solution of Nb(MeCp)$_2$(Cl)$_2$ (2.32 g, 5.9 mmol) in ca. 20 mL of THF at −78° C. The mixture was stirred overnight at room temperature. Solvent was then removed under vacuum and the product was extracted with toluene to give a dark wax. The material was then purified by distillation up to 200° C. @ 20 mTorr (head up to 106° C.) to give a dark wax. The NMR $^1$H spectrum is provided in FIG. 14. NMR$^1$H (δ, ppm, C6D6): 4.18-5.03 (m, 8H), 2.61 (q, 2H), 1.70 (s, 6H), 1.32 (s, 3H), 0.94 (s, 9H), 0.82 (t, 3H).

Figure 15:
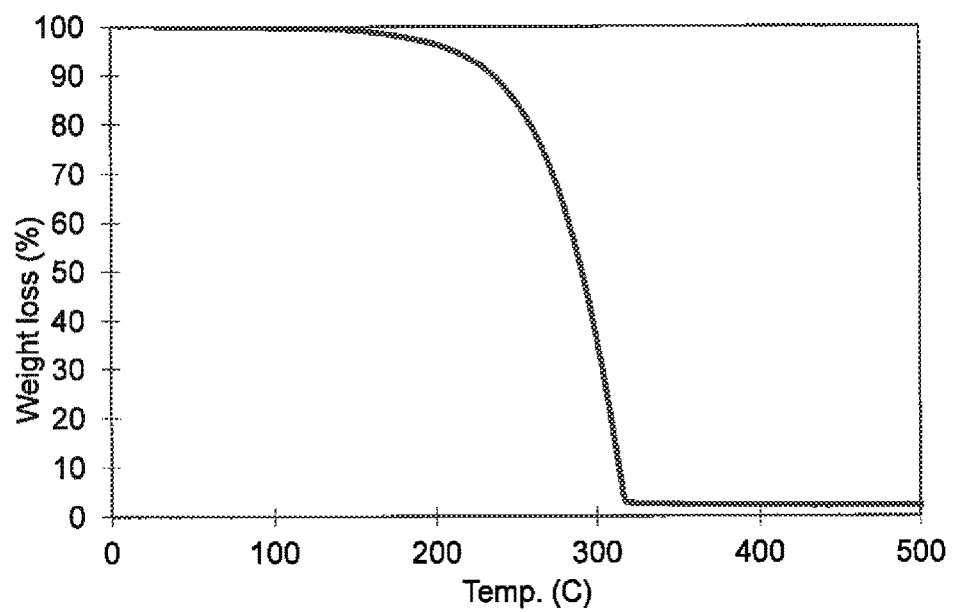
FIG. 15 is a TGA graph demonstrating the percentage of weight loss with increasing temperature of Nb(MeCp)$_2$(N$^{tBu,\ Et}$Me-amd)

The solid left a 2.2% residual mass during Open-Cup TGA analysis measured at a temperature rising rate of 10° C./min in an atmosphere which flows nitrogen at 200 mL/min (26% during Close-Cup). These results are shown in FIG. 15, which is a TGA graph illustrating the percentage of weight loss upon temperature increase.

Example 7: Bis-Ethylcyclopentadienyl Diisopropylacetamidinato Niobium Synthesis (Nb(EtCp)$_2$(N$^{iPr}$ Me-amd))

Figure 16:
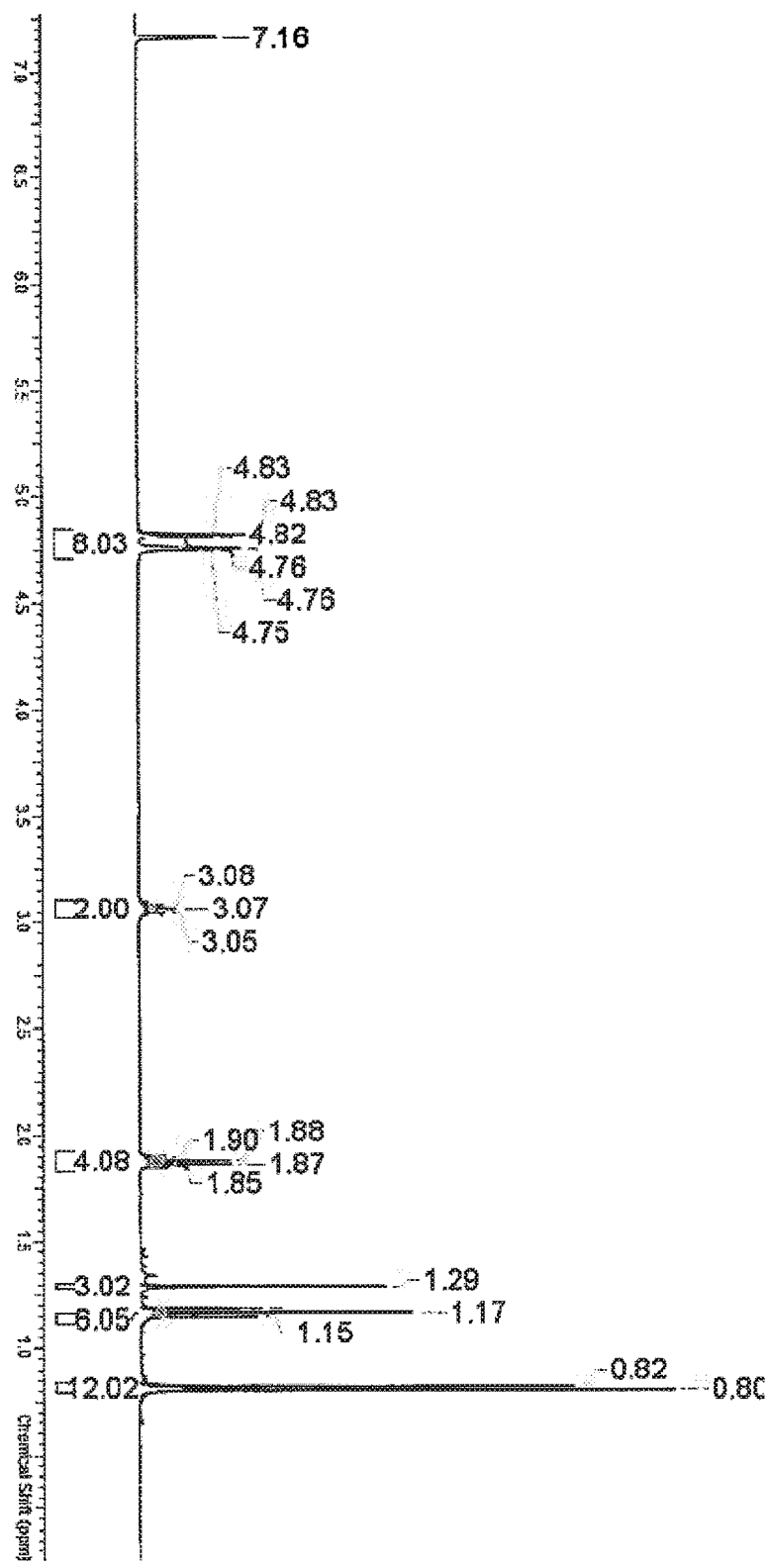
FIG. 16 is a $^1$HNMR spectrum bis-ethylcyclopentadienyl diisopropylacetamidinato Niobium [Nb(EtCp)$_2$(N$^{iPr}$ Me-amd)]

To a solution of diisopropyl carbodiimide (36.0 g, 0.28 mol) in ca. 200 mL of THF at −78° C., was added dropwise MeLi (178 mL, 0.28 mol). After stirring 5 h at room temperature, the mixture was added to a solution of Nb(EtCp)$_2$(Cl)$_2$ (50 g, 0.14 mol) in ca. 20 mL of THF at −78° C. The mixture was stirred overnight at room temperature. Solvent was then removed under vacuum and the product was extracted with toluene to give a dark liquid. The material was then purified by distillation up to 220° C. @ 20 mTorr (head up to 150° C.) to give 21.35 g (36%) of dark liquid. The NMR $^1$H spectrum is provided in FIG. 16. NMR$^1$H (δ, ppm, C6D6): 4.75-4.81 (m, 8H), 3.07 (m, 2H), 1.86 (q, 4H), 1.30 (s, 3H), 1.16 (t, 6H), 0.80 (d, 12H).

The solid left a 2.3% residual mass during Open-Cup TGA analysis measured at a temperature rising rate of 10°

Figure 17:
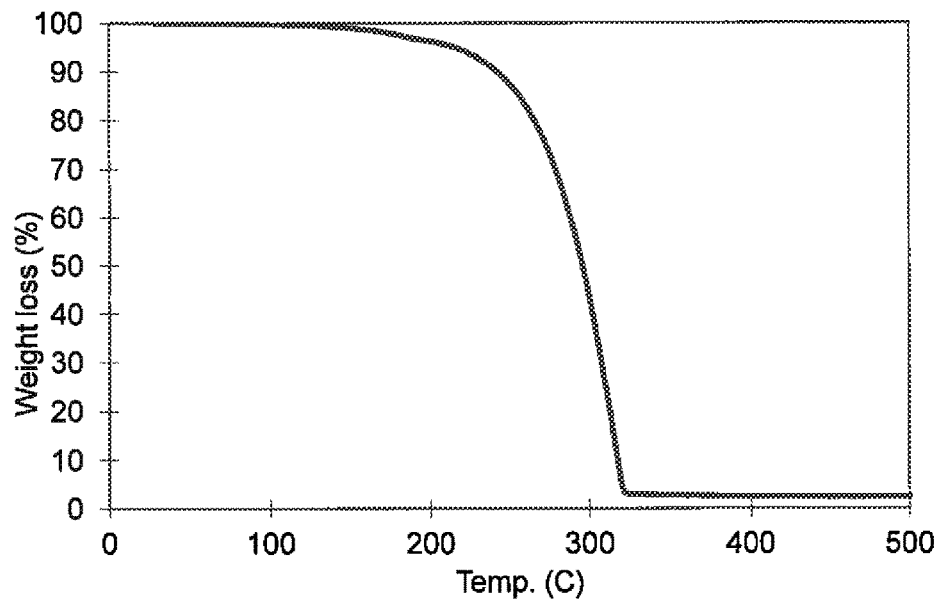
FIG. 17 is a TGA graph demonstrating the percentage of weight loss with increasing temperature of Nb(EtCp)$_2$(N$^{iPr}$ Me-amd)

C./min in an atmosphere which flows nitrogen at 200 mL/min (26% during Close-Cup). These results are shown in FIG. 17, which is a TGA graph illustrating the percentage of weight loss upon temperature increase.

Example 8: ALD of NbN Using Nb(EtCp)$_2$(N$^{iPr}$ Me-amd)

Figure 18:
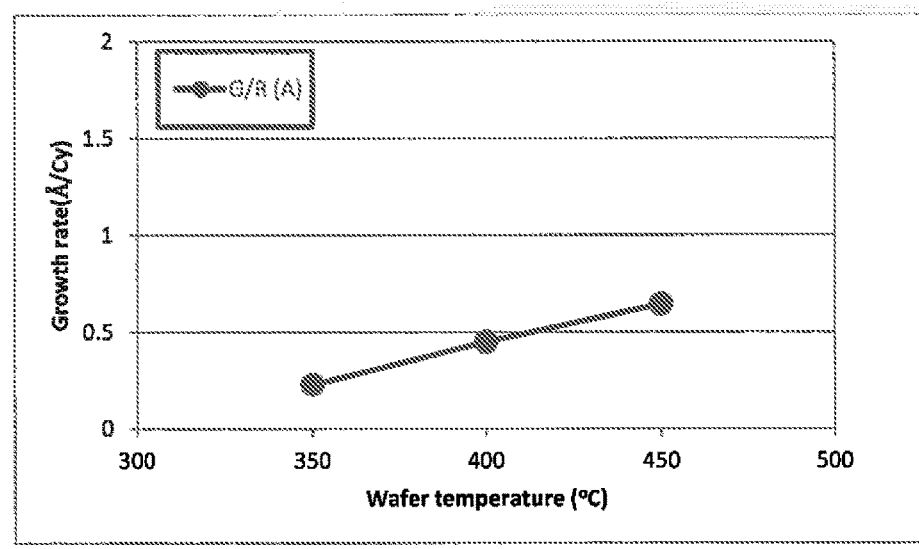
FIG. 18 is a graph showing the NbN film growth rate as a function of the temperature using Nb(EtCp)$_2$(N$^{iPr}$ Me-amd)

ALD tests were performed using Nb(EtCp)$_2$(N$^{iPr}$ Me-amd), which was be placed in a vessel heated up to 150° C. and NH$_3$ as Co— reactant. Typical ALD conditions were used with a reactor pressure fixed at ~2 Torr. FIG. 18 shows the growth rates of NbN films using Nb(EtCp)$_2$(N$^{iPr}$ Me-amd) between 350 and 450° C.

Figure 19:
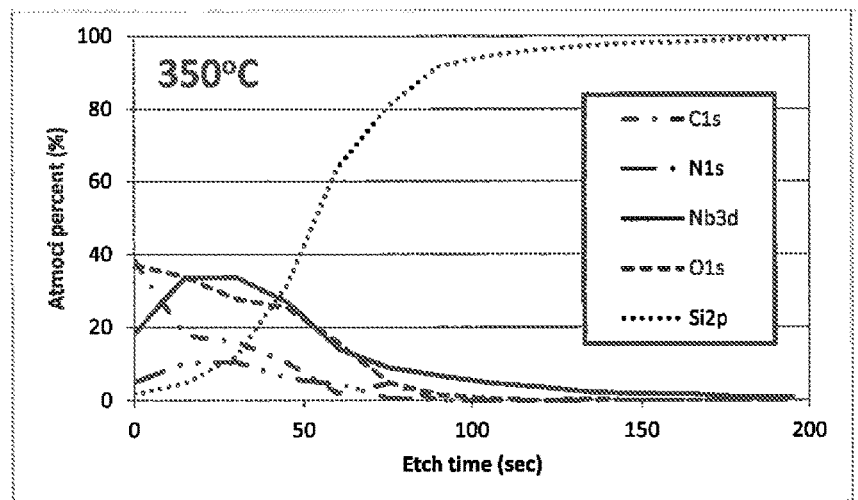
FIG. 19 is a graph showing the XPS analysis of the films produced at 350° C. using Nb(EtCp)$_2$(N$^{iPr}$ Me-amd)
Figure 20:
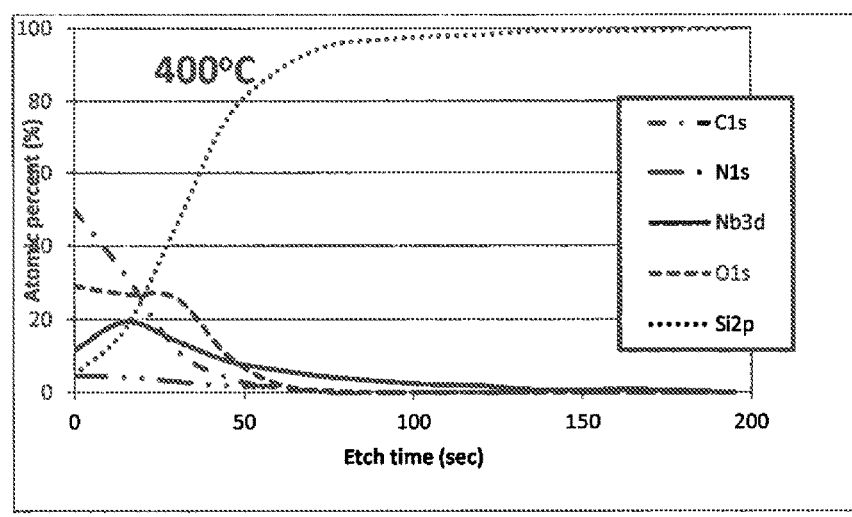
FIG. 20 is a graph showing the XPS analysis of the films produced at 400° C. using Nb(EtCp)$_2$(N$^{iPr}$ Me-amd)

FIG. 19 and FIG. 20 show the X-ray Photoelectron Spectroscopy (XPS) analysis of the films produced at respectively at 350 and 400° C. Resistivity of the NbN film produced at 350° C. was measured at ~700 µΩ·cm.

Example 9: Bis-Isopropylcyclopentadienyl Diisopropylacetamidinato Niobium Synthesis (Nb (iPrCp)$_2$(N$^{iPr}$ Me-amd))

Figure 21:
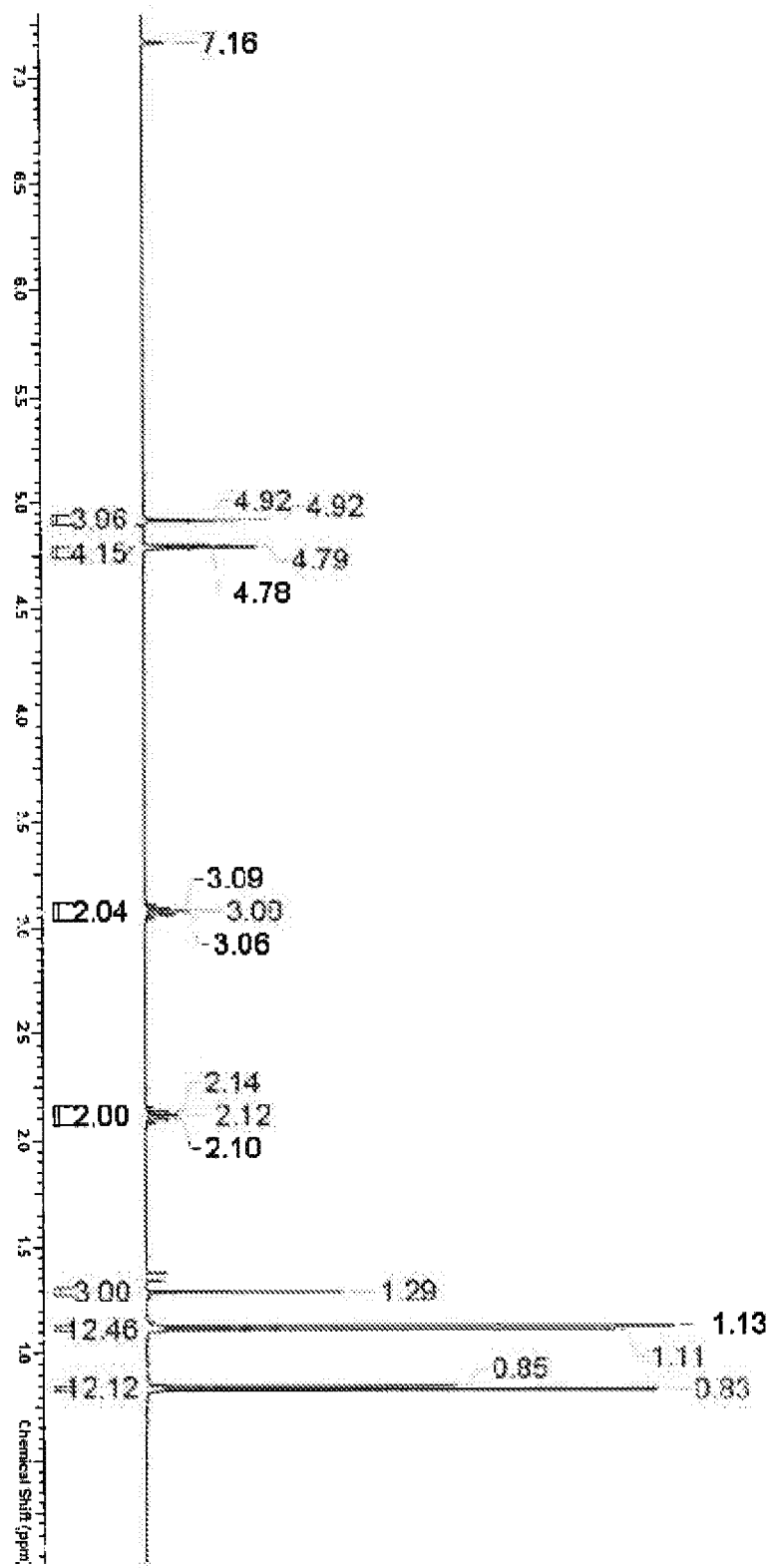
FIG. 21 is a $^1$HNMR spectrum bis-isopropylcyclopentadienyl diisopropylacetamidinato Niobium [Nb(iPrCp)$_2$(N$^{iPr}$ Me-amd)]

To a solution of diisopropyl carbodiimide (1.5 g, 11.9 mmol) in ca. 20 mL of THF at −78° C., was added dropwise MeLi (7.4 mL, 11.9 mmol). After stirring 3 h at room temperature, the mixture was added to a solution of Nb(iPrCp)$_2$(Cl)$_2$ (2.64 g, 5.9 mmol) in ca. 20 mL of THF at −78° C. The mixture was stirred overnight at room temperature. Solvent was then removed under vacuum and the product was extracted with toluene to give a dark oil. The material was then purified by distillation up to 190° C. @ 75 mTorr (head up to 86° C.) to give 0.85 g (32%) of dark liquid. The NMR $^1$H spectrum is provided in FIG. 21. NMR$^1$H (δ, ppm, C6D6): 4.79-4.92 (m, 8H), 3.08 (m, 2H), 2.12 (m, 2H), 1.29 (s, 3H), 1.11 (d, 12H), 0.83 (d, 12H).

Figure 22:
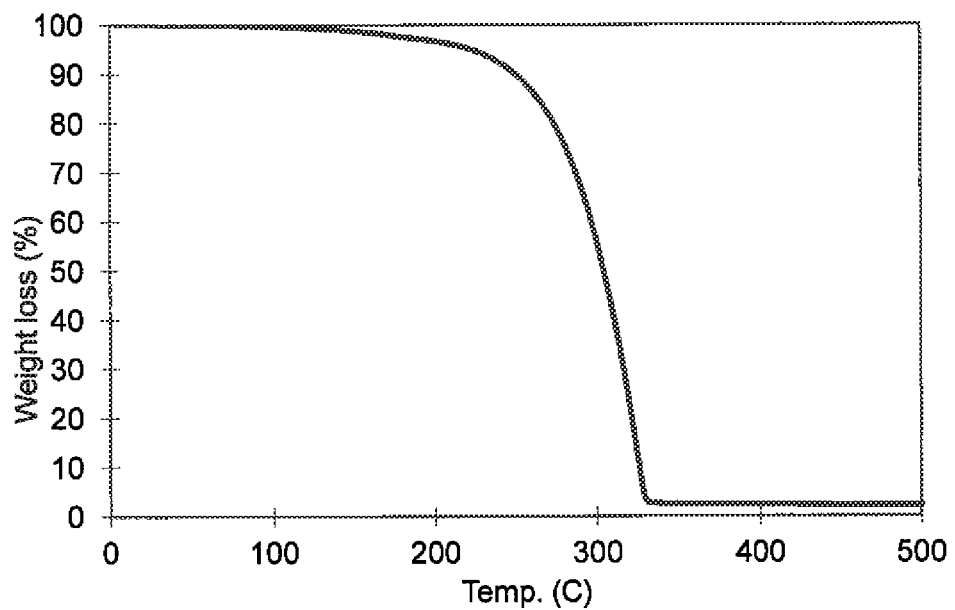
FIG. 22 is a TGA graph demonstrating the percentage of weight loss with increasing temperature of Nb(iPrCp)$_2$(N$^{iPr}$ Me-amd).

The solid left a 2.2% residual mass during Open-Cup TGA analysis measured at a temperature rising rate of 10° C./min in an atmosphere which flows nitrogen at 200 mL/min (27% during Close-Cup). These results are shown in FIG. 22, which is a TGA graph illustrating the percentage of weight loss upon temperature increase.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

We claim:

1. A Niobium Nitride film forming composition comprising a precursor having the formula Nb(R$_5$Cp)$_2$(L)

wherein each R is independently H, an alkyl group, or R'$_3$Si, with each R' independently being H or an alkyl group; Cp is cyclopentadienyl; and L is selected from the group consisting of formamidinate ([R—N═C(H)═N—R'] or N$^{R, R'}$-fmd or NR-fmd when R═R'), amidinate ([R—N═C(R")═N—R'] or N$^{R, R'}$ R"-amd or N$^R$ R"-amd when R═R'), and guanidinate ([R—N═C(NR"R''')═NR'] or N$^{R, R', N^{R''}, R'''}$-gnd or N$^R$, N$^{R''}$-gnd when R═R' and R"═R''') and each R, R', R", and R" of the formamidinate, amidinate, or guanidinate ligand is independently H, a C1 to C6 alkyl group, or R'$_3$Si defined above.

2. The Niobium Nitride film forming composition of claim 1, wherein the precursor has the formula Nb(R$_5$Cp)$_2$ (N$^{R, R'}$-fmd) or Nb(R$_5$Cp)$_2$(N$^R$-fmd) when R═R'.

3. The Niobium Nitride film forming composition of claim 2, wherein each R and R' is independently selected from the group consisting of H, Me, Et, nPr, iPr, tBu, sBu, iBu, nBu, tAmyl, SiMe$_3$, SiMe$_2$H, and SiH$_2$Me.

4. The Niobium Nitride film forming composition of claim 3, wherein the precursor is selected from the group consisting Nb(Cp)$_2$(N$^{Me}$-fmd), Nb(Cp)$_2$(N$^{Et}$-fmd), Nb(Cp)$_2$(N$^{iPr}$-fmd), Nb(Cp)$_2$(N$^{nPr}$-fmd), Nb(Cp)$_2$(N$^{iBu}$-fmd), Nb(Cp)$_2$(N$^{nBu}$-fmd), Nb(Cp)$_2$(N$^{tBu}$-fmd), Nb(Cp)$_2$(N$^{sBu}$-fmd), Nb(Cp)$_2$(N$^{tAm}$-fmd), Nb(Cp)$_2$(N$^{TMS}$-fmd), Nb(MeCp)$_2$(N$^{Me}$-fmd), Nb(MeCp)$_2$(N$^{Et}$-fmd), Nb(MeCp)$_2$(N$^{iPr}$-fmd), Nb(MeCp)$_2$(N$^{nPr}$-fmd), Nb(MeCp)$_2$(N$^{iBu}$-fmd), Nb(MeCp)$_2$(N$^{nBu}$-fmd), Nb(MeCp)$_2$(N$^{tBu}$-fmd), Nb(MeCp)$_2$(N$^{sBu}$-fmd), Nb(MeCp)$_2$(N$^{tAm}$-fmd), Nb(MeCp)$_2$(N$^{TMS}$-fmd), Nb(EtCp)$_2$(N$^{Me}$-fmd), Nb(EtCp)$_2$(N$^{Et}$-fmd), Nb(EtCp)$_2$(N$^{iPr}$-fmd), Nb(EtCp)$_2$(N$^{nPr}$-fmd), Nb(EtCp)$_2$(N$^{iBu}$-fmd), Nb(EtCp)$_2$(N$^{nBu}$-fmd), Nb(EtCp)$_2$(N$^{tBu}$-fmd), Nb(EtCp)$_2$(N$^{sBu}$-fmd), Nb(EtCp)$_2$(N$^{tAm}$-fmd), Nb(EtCp)$_2$(N$^{TMS}$-fmd), Nb(iPrCp)$_2$(N$^{Me}$-fmd), Nb(iPrCp)$_2$(N$^{Et}$-fmd), Nb(iPrCp)$_2$(N$^{iPr}$-fmd), Nb(iPrCp)$_2$(N$^{nPr}$-fmd), Nb(iPrCp)$_2$(N$^{iBu}$-fmd), Nb(iPrCp)$_2$(N$^{nBu}$-fmd), Nb(iPrCp)$_2$(N$^{tBu}$-fmd), Nb(iPrCp)$_2$(N$^{sBu}$-fmd), Nb(iPrCp)$_2$(N$^{tAm}$-fmd), Nb(iPrCp)$_2$(N$^{TMS}$-fmd), Nb(tBuCp)$_2$(N$^{Me}$-fmd), Nb(tBuCp)$_2$(N$^{Et}$-fmd), Nb(tBuCp)$^2$(N$^{iPr}$-fmd), Nb(tBuCp)$^2$(N$^{nPr}$-fmd), Nb(tBuCp)$_2$(N$^{iBu}$-fmd), Nb(tBuCp)$_2$(N$^{nBu}$-fmd), Nb(tBuCp)$_2$(N$^{tBu}$-fmd), Nb(tBuCp)$_2$(N$^{sBu}$-fmd), Nb(tBuCp)$_2$(N$^{tAm}$-fmd), Nb(tBuCp)$_2$(N$^{TMS}$-fmd), Nb(iPr$_3$Cp)$_2$(N$^{Me}$-fmd), Nb(iPr$_3$Cp)$_2$(N$^{Et}$-fmd), Nb(iPr$_3$Cp)$_2$(N$^{iPr}$-fmd), Nb(iPr$_3$Cp)$_2$(N$^{nPr}$-fmd), Nb(iPr$_3$Cp)$_2$(N$^{iBu}$-fmd), Nb(iPr$_3$Cp)$_2$(N$^{nBu}$-fmd), Nb(iPr$_3$Cp)$_2$(N$^{tBu}$-fmd), Nb(iPr$_3$Cp)$_2$(N$^{sBu}$-fmd), Nb(iPr$_3$Cp)$_2$(N$^{tAm}$-fmd), Nb(iPr$_3$Cp)$_2$(N$^{TMS}$-fmd), Nb(Cp*)$_2$(N$^{Me}$-fmd), Nb(Cp*)$_2$(N$^{Et}$-fmd), Nb(Cp*)$_2$(N$^{iPr}$-fmd), Nb(Cp*)$_2$(N$^{nPr}$-fmd), Nb(Cp*)$_2$(N$^{iBu}$-fmd), Nb(Cp*)$_2$(N$^{nBu}$-fmd), Nb(Cp*)$_2$(N$^{tBu}$-fmd), Nb(Cp*)$_2$(N$^{sBu}$-fmd), Nb(Cp*)$_2$(N$^{tAm}$-fmd), Nb(Cp*)$_2$(N$^{TMS}$-fmd), Nb(Me$_3$SiCp)$_2$(N$^{Me}$-fmd), Nb(Me$_3$SiCp)$_2$(N$^{Et}$-fmd), Nb(Me$_3$SiCp)$_2$(N$^{iPr}$-fmd), Nb(Me$_3$SiCp)$_2$(N$^{nPr}$-fmd), Nb(Me$_3$SiCp)$_2$(N$^{iBu}$-fmd), Nb(Me$_3$SiCp)$_2$(N$^{nBu}$-fmd), Nb(Me$_3$SiCp)$_2$(N$^{tBu}$-fmd), Nb(Me$_3$SiCp)$_2$(N$^{sBu}$-fmd), Nb(Me$_3$SiCp)$_2$(N$^{tAm}$-fmd), Nb(Me$_3$SiCp)$_2$(N$^{TMS}$-fmd), Nb(Cp)(Cp*)(N$^{Me}$-fmd), Nb(Cp)(iPr$_3$Cp)(N$^{Me}$-fmd), Nb(Cp)(MeCp)(N$^{Et}$-fmd), Nb(Cp)(EtCp)(N$^{iPr}$-fmd), Nb(Cp)(iPrCp)(N$^{nPr}$-fmd), Nb(Cp)(nPrCp)(N$^{iBu}$-fmd), Nb(Cp)(iBuCp)(N$^{nBu}$-fmd), Nb(Cp)(tBuCp)(N$^{tBu}$-fmd), Nb(Cp)(tAmCp)(N$^{sBu}$-fmd), Nb(Cp)$_2$(N$^{Et,}$ tBu-fmd), Nb(MeCp)$_2$(N$^{Et, tBu}$-fmd), and Nb(EtCp)$_2$(N$^{Et, tBu}$-fmd), wherein Cp* is pentamethylcyclopentadienyl.

5. The Niobium Nitride film forming composition of claim 4, wherein the precursor is Nb(EtCp)$_2$(N$^{iPr}$-fmd).

6. The Niobium Nitride film forming composition of claim 1, wherein the precursor has the formula Nb(R$_5$Cp)$_2$ (N$^{R, R'}$ R"-amd) or Nb(R$_5$Cp)$_2$(N$^R$ R"-amd) when R═R'.

7. The Niobium Nitride film forming composition of claim 6, wherein each R, R', and R" is independently selected from the group consisting of H, Me, Et, nPr, iPr, tBu, sBu, iBu, nBu, tAmyl, SiMe$_3$, SiMe$_2$H, and SiH$_2$Me.

8. The Niobium Nitride film forming composition of claim 7, wherein the precursor is selected from the group consisting of Nb(Cp)$_2$(N$^{Me}$ Me-amd), Nb(Cp)$_2$(N$^{Et}$ Me-amd), Nb(Cp)$_2$(N$^{iPr}$ Me-amd), Nb(Cp)$_2$(N$^{nPr}$ Me-amd), Nb(Cp)$_2$(N$^{iBu}$ Me-amd), Nb(Cp)$_2$(N$^{nBu}$ Me-amd), Nb(Cp)$_2$ (N$^{tBu}$ Me-amd), Nb(Cp)$_2$(N$^{sBu}$ Me-amd), Nb(Cp)$_2$(N$^{tAm}$ Me-amd), Nb(Cp)$_2$(N$^{TMS}$ Me-amd), Nb(MeCp)$_2$(N$^{Me}$ Me-amd), Nb(MeCp)$_2$(N$^{Et}$ Me-amd), Nb(MeCp)$_2$(N$^{iPr}$ Me-amd), Nb(MeCp)$_2$(N$^{nPr}$ Me-amd), Nb(MeCp)$_2$(N$^{iBu}$ Me-amd), Nb(MeCp)$_2$(N$^{nBu}$ Me-amd), Nb(MeCp)$_2$(N$^{sBu}$ Me-amd), Nb(MeCp)$_2$(N$^{tAm}$ Me-amd), Nb(MeCp)$_2$(N$^{TMS}$ Me-amd), Nb(EtCp)$_2$(N$^{Me}$ Me-amd), Nb(EtCp)$_2$(N$^{Et}$ Me-amd), Nb(EtCp)$_2$(N$^{iPr}$ Me-amd), Nb(EtCp)$_2$(N$^{nPr}$ Me-amd), Nb(EtCp)$_2$(N$^{iBu}$ Me-amd), Nb(EtCp)$_2$(N$^{nBu}$ Me-amd), Nb(EtCp)$_2$(N$^{tBu}$ Me-amd), Nb(EtCp)$_2$(N$^{sBu}$ Me-amd), Nb(EtCp)$_2$(N$^{tAm}$ Me-amd), Nb(EtCp)$_2$(N$^{TMS}$ Me-amd), Nb(iPrCp)$_2$(N$^{Me}$ Me-amd), Nb(iPrCp)$_2$(N$^{Et}$ Me-amd), Nb(iPrCp)$_2$(N$^{iPr}$ Me-amd), Nb(iPrCp)$_2$(N$^{nPr}$ Me-amd), Nb(iPrCp)$_2$(N$^{iBu}$ Me-amd), Nb(iPrCp)$_2$(N$^{nBu}$ Me-amd), Nb(iPrCp)$_2$(N$^{tBu}$ Me-amd), Nb(iPrCp)$_2$(N$^{sBu}$ Me-amd), Nb(iPrCp)$_2$(N$^{tAm}$ Me-amd), Nb(iPrCp)$_2$(N$^{TMS}$ Me-amd), Nb(tBuCp)$_2$(N$^{Me}$ Me-amd), Nb(tBuCp)$_2$(N$^{Et}$ Me-amd), Nb(tBuCp)$_2$(N$^{iPr}$ Me-amd), Nb(tBuCp)$_2$(N$^{nPr}$ Me-amd), Nb(tBuCp)$_2$(N$^{iBu}$ Me-amd), Nb(tBuCp)$_2$(N$^{nBu}$ Me-amd), Nb(tBuCp)$_2$(N$^{tBu}$ Me-amd), Nb(tBuCp)$_2$(N$^{sBu}$ Me-amd), Nb(tBuCp)$_2$(N$^{tAm}$ Me-amd), Nb(tBuCp)$_2$(N$^{TMS}$ Me-amd), Nb(iPr$_3$Cp)$_2$(N$^{Me}$ Me-amd), Nb(iPr$_3$Cp)$_2$(N$^{Et}$ Me-amd), Nb(iPr$_3$Cp)$_2$(N$^{iPr}$ Me-amd), Nb(iPr$_3$Cp)$_2$(N$^{nPr}$ Me-amd), Nb(iPr$_3$Cp)$_2$(N$^{iBu}$ Me-amd), Nb(iPr$_3$Cp)$_2$(N$^{nBu}$ Me-amd), Nb(iPr$_3$Cp)$_2$(N$^{tBu}$ Me-amd), Nb(iPr$_3$Cp)$_2$(N$^{sBu}$ Me-amd), Nb(iPr$_3$Cp)$_2$(N$^{tAm}$ Me-amd), Nb(iPr$_3$Cp)$_2$(N$^{TMS}$ Me-amd), Nb(Cp*)$_2$(N$^{Me}$ Me-amd), Nb(Cp*)$_2$(N$^{Et}$ Me-amd), Nb(Cp*)$_2$(N$^{iPr}$ Me-amd), Nb(Cp*)$_2$(N$^{nPr}$ Me-amd), Nb(Cp*)$_2$(N$^{iBu}$ Me-amd), Nb(Cp*)$_2$(N$^{nBu}$ Me-amd), Nb(Cp*)$_2$(N$^{tBu}$ Me-amd), Nb(Cp*)$_2$(N$^{sBu}$ Me-amd), Nb(Cp*)$_2$(N$^{tAm}$ Me-amd), Nb(Cp*)$_2$(N$^{TMS}$ Me-amd), Nb(Me$_3$SiCp)$_2$(N$^{Me}$ Me-amd), Nb(Me$_3$SiCp)$_2$(N$^{Et}$ Me-amd), Nb(Me$_3$SiCp)$_2$(N$^{iPr}$ Me-amd), Nb(Me$_3$SiCp)$_2$(N$^{nPr}$ Me-amd), Nb(Me$_3$SiCp)$_2$(N$^{iBu}$ Me-amd), Nb(Me$_3$SiCp)$_2$(N$^{nBu}$ Me-amd), Nb(Me$_3$SiCp)$_2$(N$^{tBu}$ Me-amd), Nb(Me$_3$SiCp)$_2$(N$^{sBu}$ Me-amd), Nb(Me$_3$SiCp)$_2$(N$^{tAm}$ Me-amd), Nb(Me$_3$SiCp)$_2$(N$^{TMS}$ Me-amd), Nb(Cp)(Cp*)(N$^{Me}$ Me-amd), Nb(Cp)(iPr$_3$Cp) (N$^{Me}$ Me-amd), Nb(Cp)(MeCp)(N$^{Et}$ Me-amd), Nb(Cp)(EtCp)(N$^{iPr}$ Me-amd), Nb(Cp)(iPrCp)(N$^{nPr}$ Me-amd), Nb(Cp)(nPrCp)(N$^{iBu}$ Me-amd), Nb(Cp)(iBuCp)(N$^{nBu}$ Me-amd), Nb(Cp)(tBuCp)(N$^{tBu}$ Me-amd), Nb(Cp)(tAmCp)(N$^{sBu}$ Me-amd), Nb(Cp)$_2$(N$^{iPr}$ Et-amd), Nb(Cp)$_2$(N$^{iPr}$ nPr-amd), Nb(Cp)$_2$(N$^{iPr}$ iPr-amd), Nb(Cp)$_2$(N$^{iPr}$ tBu-amd), Nb(Cp)$_2$(N$^{iPr}$ nBu-amd), Nb(Cp)$_2$(N$^{iPr}$ iBu-amd), Nb(Cp)$_2$(N$^{iPr}$ sBu-amd), Nb(MeCp)$_2$(N$^{iPr}$ Et-amd), Nb(MeCp)$_2$(N$^{iPr}$ nPr-amd), Nb(MeCp)$_2$(N$^{iPr}$ iPr-amd), Nb(MeCp)$_2$(N$^{iPr}$ tBu-amd), Nb(MeCp)$_2$(N$^{iPr}$ nBu-amd), Nb(MeCp)$_2$(N$^{iPr}$ iBu-amd), Nb(MeCp)$_2$(N$^{iPr}$ sBu-amd), Nb(EtCp)$_2$(N$^{iPr}$ Et-amd), Nb(EtCp)$_2$(N$^{iPr}$ nPr-amd), Nb(EtCp)$_2$(N$^{iPr}$ iPr-amd), Nb(EtCp)$_2$(N$^{iPr}$ tBu-amd), Nb(EtCp)$_2$(N$^{iPr}$ nBu-amd), Nb(EtCp)$_2$(N$^{iPr}$ iBu-amd), and Nb(EtCp)$_2$(N$^{iPr}$ sBu-amd), wherein Cp* is pentamethylcyclopentadienyl.

9. The Niobium Nitride film forming composition of claim 8, wherein the precursor is Nb(EtCp)$_2$(N$^{iPr}$ Me-amd).

10. The Niobium Nitride film forming composition of claim 1, wherein the precursor has the formula Nb(R$_5$Cp)$_2$ (N$^{R,\ R'}$, N$^{R'',\ R'''}$-gnd) or Nb(R$_5$Cp)$_2$(N$^R$, N$^{R''}$-gnd) when R=R' and R''=R'''.

11. The Niobium Nitride film forming composition of claim 10, wherein each R, R', R", and R'" is independently selected from the group consisting of H, Me, Et, nPr, iPr, tBu, sBu, iBu, nBu, tAmyl, SiMe$_3$, SiMe$_2$H, and SiH$_2$Me.

12. The Niobium Nitride film forming composition of claim 11, wherein the precursor is selected from the group consisting of Nb(Cp)$_2$(N$^{Me}$, N$^{Me}$-gnd), Nb(Cp)$_2$(N$^{Et}$, N$^{Me}$-gnd), Nb(Cp)$_2$(N$^{iPr}$, N$^{Me}$-gnd), Nb(Cp)$_2$(N$^{nPr}$, N$^{Me}$-gnd), Nb(Cp)$_2$(N$^{iBu}$, N$^{Me}$-gnd), Nb(Cp)$_2$(N$^{nBu}$, N$^{Me}$-gnd), Nb(Cp)$_2$(N$^{tBu}$, N$^{Me}$-gnd), Nb(Cp)$_2$(N$^{sBu}$, N$^{Me}$-gnd), Nb(Cp)$_2$(N$^{tAm}$, N$^{Me}$-gnd), Nb(Cp)$_2$(N$^{TMS}$, N$^{Me}$-gnd), Nb(MeCp)$_2$(N$^{Me}$, N$^{Me}$-gnd), Nb(MeCp)$_2$(N$^{Et}$, N$^{Me}$-gnd), Nb(MeCp)$_2$(N$^{iPr}$, N$^{Me}$-gnd), Nb(MeCp)$_2$(N$^{nPr}$, N$^{Me}$-gnd), Nb(MeCp)$_2$(N$^{iBu}$, N$^{Me}$-gnd), Nb(MeCp)$_2$(N$^{nBu}$, N$^{Me}$-gnd), Nb(MeCp)$_2$(N$^{tBu}$, N$^{Me}$-gnd), Nb(MeCp)$_2$(N$^{sBu}$, N$^{Me}$-gnd), Nb(MeCp)$_2$(N$^{tAm}$, N$^{Me}$-gnd), Nb(MeCp)$_2$(N$^{TMS}$, N$^{Me}$-gnd), Nb(EtCp)$_2$(N$^{Me}$, N$^{Me}$-gnd), Nb(EtCp)$_2$(N$^{Et}$, N$^{Me}$-gnd), Nb(EtCp)$_2$(N$^{iPr}$, N$^{Me}$-gnd), Nb(EtCp)$_2$(N$^{nPr}$, N$^{Me}$-gnd), Nb(EtCp)$_2$(N$^{iBu}$, N$^{Me}$-gnd), Nb(EtCp)$_2$(N$^{nBu}$, N$^{Me}$-gnd), Nb(EtCp)$_2$(N$^{tBu}$, N$^{Me}$-gnd), Nb(EtCp)$_2$(N$^{sBu}$, N$^{Me}$-gnd), Nb(EtCp)$_2$(N$^{tAm}$, N$^{Me}$-gnd), Nb(EtCp)$_2$(N$^{TMS}$, N$^{Me}$-gnd), Nb(iPrCp)$_2$(N$^{Me}$, N$^{Me}$-gnd), Nb(iPrCp)$_2$(N$^{Et}$, N$^{Me}$-gnd), Nb(iPrCp)$_2$(N$^{iPr}$, N$^{Me}$-gnd), Nb(iPrCp)$_2$(N$^{nPr}$, N$^{Me}$-gnd), Nb(iPrCp)$_2$(N$^{iBu}$, N$^{Me}$-gnd), Nb(iPrCp)$_2$(N$^{nBu}$, N$^{Me}$-gnd), Nb(iPrCp)$_2$(N$^{tBu}$, N$^{Me}$-gnd), Nb(iPrCp)$_2$(N$^{sBu}$, N$^{Me}$-gnd), Nb(iPrCp)$_2$(N$^{tAm}$, N$^{Me}$-gnd), Nb(iPrCp)$_2$(N$^{TMS}$, N$^{Me}$-gnd), Nb(tBuCp)$_2$(N$^{Me}$, N$^{Me}$-gnd), Nb(tBuCp)$_2$(N$^{Et}$, N$^{Me}$-gnd), Nb(tBuCp)$_2$(N$^{iPr}$, N$^{Me}$-gnd), Nb(tBuCp)$_2$(N$^{nPr}$, N$^{Me}$-gnd), Nb(tBuCp)$_2$(N$^{iBu}$, N$^{Me}$-gnd), Nb(tBuCp)$_2$(N$^{nBu}$, N$^{Me}$-gnd), Nb(tBuCp)$_2$(N$^{tBu}$, N$^{Me}$-gnd), Nb(tBuCp)$_2$(N$^{sBu}$, N$^{Me}$-gnd), Nb(tBuCp)$_2$(N$^{tAm}$, N$^{Me}$-gnd), Nb(tBuCp)$_2$(N$^{TMS}$, N$^{Me}$-gnd), Nb(iPr$_3$Cp)$_2$(N$^{Me}$, N$^{Me}$-gnd), Nb(iPr$_3$Cp)$_2$(N$^{Et}$, N$^{Me}$-gnd), Nb(iPr$_3$Cp)$_2$(N$^{iPr}$, N$^{Me}$-gnd), Nb(iPr$_3$Cp)$_2$(N$^{nPr}$, N$^{Me}$-gnd), Nb(iPr$_3$Cp)$_2$(N$^{iBu}$, N$^{Me}$-gnd), Nb(iPr$_3$Cp)$_2$(N$^{nBu}$, N$^{Me}$-gnd), Nb(iPr$_3$Cp)$_2$(N$^{tBu}$, N$^{Me}$-gnd), Nb(iPr$_3$Cp)$_2$(N$^{sBu}$, N$^{Me}$-gnd), Nb(iPr$_3$Cp)$_2$(N$^{tAm}$, N$^{Me}$-gnd), Nb(iPr$_3$Cp)$_2$(N$^{TMS}$, N$^{Me}$-gnd), Nb(Cp*)$_2$(N$^{Me}$, N$^{Me}$-gnd), Nb(Cp*)$_2$(N$^{Et}$, N$^{Me}$-gnd), Nb(Cp*)$_2$(N$^{iPr}$, N$^{Me}$-gnd), Nb(Cp*)$_2$(N$^{nPr}$, N$^{Me}$-gnd), Nb(Cp*)$_2$(N$^{iBu}$, N$^{Me}$-gnd), Nb(Cp*)$_2$(N$^{nBu}$, N$^{Me}$-gnd), Nb(Cp*)$_2$(N$^{tBu}$, N$^{Me}$-gnd), Nb(Cp*)$_2$(N$^{sBu}$, N$^{Me}$-gnd), Nb(Cp*)$_2$(N$^{tAm}$, N$^{Me}$-gnd), Nb(Cp*)$_2$(N$^{TMS}$, N$^{Me}$-gnd), Nb(Me$_3$SiCp)$_2$(N$^{Me}$, N$^{Me}$-gnd), Nb(Me$_3$SiCp)$_2$(N$^{Et}$, N$^{Me}$-gnd), Nb(Me$_3$SiCp)$_2$(N$^{iPr}$, N$^{Me}$-gnd), Nb(Me$_3$SiCp)$_2$(N$^{nPr}$, N$^{Me}$-gnd), Nb(Me$_3$SiCp)$_2$(N$^{iBu}$, N$^{Me}$-gnd), Nb(Me$_3$SiCp)$_2$(N$^{nBu}$, N$^{Me}$-gnd), Nb(Me$_3$SiCp)$_2$(N$^{tBu}$, N$^{Me}$-gnd), Nb(Me$_3$SiCp)$_2$(N$^{sBu}$, N$^{Me}$-gnd), Nb(Me$_3$SiCp)$_2$(N$^{tAm}$, N$^{Me}$-gnd), Nb(Me$_3$SiCp)$_2$(N$^{TMS}$, N$^{Me}$-gnd), Nb(Cp)(Cp*)(N$^{Me}$, N$^{Me}$-gnd), Nb(Cp)(iPr$_3$Cp)(N$^{Me}$, N$^{Me}$-gnd), Nb(Cp)(MeCp)(N$^{Et}$, N$^{Me}$-gnd), Nb(Cp)(EtCp)(N$^{iPr}$, N$^{Me}$-gnd), Nb(Cp)(iPrCp)(N$^{nPr}$, N$^{Me}$-gnd), Nb(Cp)(nPrCp)(N$^{iBu}$, N$^{Me}$-gnd), Nb(Cp)(iBuCp)(N$^{nBu}$, N$^{Me}$-gnd), Nb(Cp)(tBuCp)(N$^{tBu}$, N$^{Me}$-gnd), Nb(Cp)(tAmCp)(N$^{sBu}$, N$^{Me}$-gnd), Nb(Cp)$_2$(N$^{iPr}$, N$^{Me,\ Et}$-gnd), Nb(Cp)$_2$(N$^{iPr}$, N$^{Et}$-gnd), Nb(Cp)$_2$(N$^{iPr}$, N$^{nPr}$-gnd), Nb(Cp)$_2$(N$^{iPr}$, N$^{iPr}$-gnd), Nb(MeCp)$_2$(N$^{iPr}$, N$^{Me,\ Et}$-gnd), Nb(MeCp)$_2$(N$^{iPr}$, N$^{Et}$-gnd), Nb(MeCp)$_2$(N$^{iPr}$, N$^{nPr}$-gnd), Nb(MeCp)$_2$(N$^{iPr}$, N$^{iPr}$-gnd), Nb(EtCp)$_2$(N$^{iPr}$, N$^{Me,\ Et}$-gnd), Nb(EtCp)$_2$(N$^{iPr}$, N$^{Et}$-gnd), Nb(EtCp)$_2$(N$^{iPr}$, N$^{nPr}$-gnd), and Nb(EtCp)$_2$(N$^{iPr}$, N$^{iPr}$-gnd), wherein Cp* is pentamethylcyclopentadienyl.

13. The Niobium Nitride film forming composition of claim 12, wherein the precursor is Nb(EtCp)$_2$(N$^{iPr}$, N$^{Me}$-gnd).

14. The Niobium Nitride film forming composition of claim 1, the composition comprising between approximately 95% w/w and approximately 100.0% w/w of the precursor.

15. The Niobium Nitride film forming composition of claim 1, the composition comprising between approximately 0.0% w/w and approximately 5.0% w/w impurities.

16. The Niobium Nitride film forming composition of claim 1, the composition comprising between approximately 0 ppbw and approximately 500 ppbw metal impurities.

* * * * *